(12) United States Patent
Ahn et al.

(10) Patent No.: US 8,445,952 B2
(45) Date of Patent: *May 21, 2013

(54) ZR-SN-TI-O FILMS

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 18 days.

This patent is subject to a terminal disclaimer.

(21) Appl. No.: 12/609,897

(22) Filed: Oct. 30, 2009

(65) Prior Publication Data

US 2010/0044771 A1    Feb. 25, 2010

Related U.S. Application Data

(60) Division of application No. 11/084,968, filed on Mar. 21, 2005, now Pat. No. 7,611,959, which is a continuation of application No. 10/309,935, filed on Dec. 4, 2002, now Pat. No. 7,101,813.

(51) Int. Cl.
*H01L 29/788* (2006.01)

(52) U.S. Cl.
USPC .. 257/315; 257/632; 257/E29.3; 257/E29.162

(58) Field of Classification Search
USPC ................. 438/396; 257/296, 315, 368, 412, 257/632, 751, E29.3, E29.162, E21.009, 257/E21.272, E21.274
See application file for complete search history.

(56) References Cited

U.S. PATENT DOCUMENTS

| | | |
|---|---|---|
| 3,381,114 A | 4/1968 | Nakanuma |
| 4,058,430 A | 11/1977 | Suntola et al. |
| 4,215,156 A | 7/1980 | Dalal et al. |
| 4,333,808 A | 6/1982 | Bhattacharyya et al. |
| 4,399,424 A | 8/1983 | Rigby |
| 4,413,022 A | 11/1983 | Suntola et al. |

(Continued)

FOREIGN PATENT DOCUMENTS

| | | |
|---|---|---|
| EP | 0540993 A1 | 5/1993 |
| EP | 1096042 A1 | 5/2001 |

(Continued)

OTHER PUBLICATIONS

Aarik, J., et al., "Atomic layer growth of epitaxial $TiO_2$ thin films from $TiCl_4$ and $H_2O$ on $\alpha$-$Al_2O_3$ substrates", *Journal of Crystal Growth*, 242(1-2), (2002), 189-198.

(Continued)

*Primary Examiner* — Calvin Lee
*Assistant Examiner* — Monica D Harrison
(74) *Attorney, Agent, or Firm* — Schwegman, Lundberg & Woessner, P.A.

(57) ABSTRACT

A dielectric layer containing a Zr—Sn—Ti—O film and a method of fabricating such a dielectric layer produce a reliable dielectric layer having an equivalent oxide thickness thinner than attainable using $SiO_2$. In an embodiment, forming the Zr—Sn—Ti—O film on a substrate includes depositing materials of the Zr—Sn—Ti—O film substantially as atomic monolayers. In an embodiment, electronic devices include a dielectric layer having a Zr—Sn—Ti—O film such that Zr—Sn—Ti—O material is configured as substantially atomic monolayers. Dielectric layers containing such Zr—Sn—Ti—O films may have minimal reactions with a silicon substrate or other structures during processing.

27 Claims, 8 Drawing Sheets

U.S. PATENT DOCUMENTS

| | | | |
|---|---|---|---|
| 4,590,042 A | 5/1986 | Drage | |
| 4,618,947 A | 10/1986 | Tran et al. | |
| 4,647,947 A | 3/1987 | Takeoka et al. | |
| 4,725,877 A | 2/1988 | Brasen et al. | |
| 4,767,641 A | 8/1988 | Kieser et al. | |
| 4,920,071 A | 4/1990 | Thomas | |
| 4,993,358 A | 2/1991 | Mahawili | |
| 5,006,192 A | 4/1991 | Deguchi | |
| 5,057,447 A * | 10/1991 | Paterson | 438/253 |
| 5,100,825 A * | 3/1992 | Fazan et al. | 438/253 |
| 5,119,329 A | 6/1992 | Evans et al. | |
| 5,496,597 A | 3/1996 | Soininen et al. | |
| 5,595,606 A | 1/1997 | Fujikawa et al. | |
| 5,698,022 A | 12/1997 | Glassman et al. | |
| 5,735,960 A | 4/1998 | Sandhu et al. | |
| 5,795,808 A | 8/1998 | Park | |
| 5,801,105 A | 9/1998 | Yano et al. | |
| 5,810,923 A | 9/1998 | Yano et al. | |
| 5,828,080 A | 10/1998 | Yano et al. | |
| 5,840,897 A | 11/1998 | Kirlin et al. | |
| 5,912,797 A * | 6/1999 | Schneemeyer et al. | 361/311 |
| 5,916,365 A | 6/1999 | Sherman | |
| 5,923,056 A | 7/1999 | Lee et al. | |
| 5,950,925 A | 9/1999 | Fukunaga et al. | |
| 6,010,969 A | 1/2000 | Vaartstra | |
| 6,013,553 A | 1/2000 | Wallace et al. | |
| 6,020,024 A | 2/2000 | Maiti et al. | |
| 6,027,961 A | 2/2000 | Maiti et al. | |
| 6,034,015 A | 3/2000 | Lin et al. | |
| 6,044,016 A * | 3/2000 | Itoh | 365/185.17 |
| 6,057,271 A | 5/2000 | Kenjiro et al. | |
| 6,059,885 A | 5/2000 | Ohashi et al. | |
| 6,060,755 A | 5/2000 | Ma et al. | |
| 6,063,705 A | 5/2000 | Vaartstra | |
| 6,093,944 A | 7/2000 | VanDover | |
| 6,110,529 A | 8/2000 | Gardiner et al. | |
| 6,161,500 A | 12/2000 | Kopacz et al. | |
| 6,171,900 B1 | 1/2001 | Sun | |
| 6,174,809 B1 | 1/2001 | Kang et al. | |
| 6,194,237 B1 | 2/2001 | Kim et al. | |
| 6,200,893 B1 | 3/2001 | Sneh | |
| 6,203,613 B1 | 3/2001 | Gates et al. | |
| 6,206,972 B1 | 3/2001 | Dunham | |
| 6,207,522 B1 | 3/2001 | Hunt et al. | |
| 6,207,589 B1 | 3/2001 | Ma et al. | |
| 6,210,999 B1 | 4/2001 | Gardner et al. | |
| 6,211,035 B1 | 4/2001 | Moise et al. | |
| 6,217,645 B1 | 4/2001 | Vaartstra | |
| 6,225,168 B1 | 5/2001 | Gardner et al. | |
| 6,225,237 B1 | 5/2001 | Vaartstra | |
| 6,270,835 B1 | 8/2001 | Hunt et al. | |
| 6,273,951 B1 | 8/2001 | Vaartstra | |
| 6,274,937 B1 | 8/2001 | Ahn et al. | |
| 6,281,042 B1 | 8/2001 | Ahn et al. | |
| 6,281,144 B1 | 8/2001 | Cleary et al. | |
| 6,291,341 B1 | 9/2001 | Sharan et al. | |
| 6,296,943 B1 | 10/2001 | Watanabe | |
| 6,297,103 B1 | 10/2001 | Ahn et al. | |
| 6,297,539 B1 | 10/2001 | Ma et al. | |
| 6,300,203 B1 | 10/2001 | Buynoski et al. | |
| 6,302,964 B1 | 10/2001 | Umotoy et al. | |
| 6,303,481 B2 | 10/2001 | Park | |
| 6,313,035 B1 | 11/2001 | Sandhu et al. | |
| 6,329,286 B1 | 12/2001 | Vaartstra | |
| 6,348,386 B1 | 2/2002 | Gilmer | |
| 6,350,704 B1 | 2/2002 | Ahn et al. | |
| 6,368,398 B2 | 4/2002 | Vaartstra | |
| 6,368,518 B1 | 4/2002 | Vaartstra | |
| 6,368,941 B1 | 4/2002 | Chen et al. | |
| 6,380,579 B1 | 4/2002 | Nam et al. | |
| 6,383,861 B1 | 5/2002 | Gonzalez et al. | |
| 6,387,712 B1 | 5/2002 | Yano et al. | |
| 6,391,769 B1 | 5/2002 | Lee et al. | |
| 6,395,650 B1 | 5/2002 | Callegari et al. | |
| 6,407,427 B1 | 6/2002 | Oh | |
| 6,417,537 B1 | 7/2002 | Yang et al. | |
| 6,420,279 B1 | 7/2002 | Ono et al. | |
| 6,426,292 B2 | 7/2002 | Vaartstra | |
| 6,432,779 B1 | 8/2002 | Hobbs et al. | |
| 6,433,993 B1 | 8/2002 | Hunt et al. | |
| 6,441,417 B1 | 8/2002 | Zhang et al. | |
| 6,444,039 B1 | 9/2002 | Nguyen | |
| 6,444,592 B1 | 9/2002 | Ballantine et al. | |
| 6,445,023 B1 | 9/2002 | Vaartstra et al. | |
| 6,448,192 B1 | 9/2002 | Kaushik | |
| 6,451,641 B1 | 9/2002 | Halliyal et al. | |
| 6,451,695 B2 | 9/2002 | Sneh | |
| 6,454,912 B1 | 9/2002 | Ahn et al. | |
| 6,455,717 B1 | 9/2002 | Vaartstra | |
| 6,458,701 B1 | 10/2002 | Chae et al. | |
| 6,465,334 B1 | 10/2002 | Buynoski et al. | |
| 6,465,853 B1 | 10/2002 | Hobbs et al. | |
| 6,482,740 B2 | 11/2002 | Soininen et al. | |
| 6,495,436 B2 | 12/2002 | Ahn et al. | |
| 6,495,458 B2 | 12/2002 | Marsh | |
| 6,500,499 B1 | 12/2002 | Senzaki et al. | |
| 6,504,214 B1 | 1/2003 | Yu et al. | |
| 6,514,808 B1 | 2/2003 | Samavedam | |
| 6,514,820 B2 | 2/2003 | Ahn et al. | |
| 6,514,828 B2 | 2/2003 | Ahn et al. | |
| 6,521,911 B2 | 2/2003 | Parsons et al. | |
| 6,527,866 B1 | 3/2003 | Matijasevic et al. | |
| 6,528,858 B1 | 3/2003 | Yu et al. | |
| 6,531,324 B2 | 3/2003 | Hsu et al. | |
| 6,531,354 B2 | 3/2003 | Maria et al. | |
| 6,534,420 B2 | 3/2003 | Ahn et al. | |
| 6,537,613 B1 | 3/2003 | Senzaki et al. | |
| 6,538,330 B1 | 3/2003 | Forbes | |
| 6,541,079 B1 | 4/2003 | Bojarczuk, Jr. et al. | |
| 6,541,280 B2 | 4/2003 | Kaushik et al. | |
| 6,541,353 B1 | 4/2003 | Sandhu et al. | |
| 6,542,229 B1 | 4/2003 | Kalal et al. | |
| 6,544,846 B2 | 4/2003 | Ahn et al. | |
| 6,544,875 B1 | 4/2003 | Wilk | |
| 6,551,893 B1 | 4/2003 | Zheng et al. | |
| 6,551,929 B1 | 4/2003 | Kori et al. | |
| 6,552,383 B2 | 4/2003 | Ahn et al. | |
| 6,552,388 B2 | 4/2003 | Wilk et al. | |
| 6,559,472 B2 | 5/2003 | Sandhu et al. | |
| 6,562,491 B1 | 5/2003 | Jeon | |
| 6,570,248 B1 | 5/2003 | Ahn et al. | |
| 6,573,199 B2 | 6/2003 | Sandhu et al. | |
| 6,586,349 B1 | 7/2003 | Jeon et al. | |
| 6,586,792 B2 | 7/2003 | Ahn et al. | |
| 6,596,636 B2 | 7/2003 | Sandhu et al. | |
| 6,602,720 B2 | 8/2003 | Hsu et al. | |
| 6,608,378 B2 | 8/2003 | Ahn et al. | |
| 6,613,656 B2 | 9/2003 | Li | |
| 6,613,695 B2 | 9/2003 | Pomarede et al. | |
| 6,617,639 B1 | 9/2003 | Wang et al. | |
| 6,620,670 B2 | 9/2003 | Song et al. | |
| 6,620,752 B2 | 9/2003 | Messing et al. | |
| 6,627,260 B2 | 9/2003 | Derderian et al. | |
| 6,627,503 B2 | 9/2003 | Ma et al. | |
| 6,630,383 B1 | 10/2003 | Ibok et al. | |
| 6,632,279 B1 | 10/2003 | Ritala et al. | |
| 6,638,810 B2 | 10/2003 | Bakli et al. | |
| 6,638,859 B2 | 10/2003 | Sneh et al. | |
| 6,639,267 B2 | 10/2003 | Eldridge | |
| 6,642,573 B1 | 11/2003 | Halliyal et al. | |
| 6,645,882 B1 | 11/2003 | Halliyal et al. | |
| 6,652,924 B2 | 11/2003 | Sherman | |
| 6,656,764 B1 | 12/2003 | Wang et al. | |
| 6,660,660 B2 | 12/2003 | Haukka et al. | |
| 6,661,058 B2 | 12/2003 | Ahn et al. | |
| 6,673,701 B1 | 1/2004 | Marsh et al. | |
| 6,674,138 B1 | 1/2004 | Halliyal et al. | |
| 6,677,250 B2 | 1/2004 | Campbell et al. | |
| 6,682,602 B2 | 1/2004 | Vaartstra | |
| 6,683,005 B2 | 1/2004 | Sandhu et al. | |
| 6,686,212 B1 | 2/2004 | Conley, Jr. et al. | |
| 6,696,332 B2 | 2/2004 | Visokay et al. | |
| 6,699,747 B2 | 3/2004 | Ruff et al. | |
| 6,709,989 B2 | 3/2004 | Ramdani et al. | |
| 6,710,538 B1 | 3/2004 | Ahn et al. | |
| 6,713,162 B2 * | 3/2004 | Takaya et al. | 428/209 |
| 6,713,329 B1 | 3/2004 | Wagner et al. | |

| Patent | Date | Inventor |
|---|---|---|
| 6,713,846 B1 | 3/2004 | Senzaki |
| 6,720,221 B1 | 4/2004 | Ahn et al. |
| 6,728,092 B2 | 4/2004 | Hunt et al. |
| 6,730,163 B2 | 5/2004 | Vaartstra |
| 6,730,164 B2 | 5/2004 | Vaartstra et al. |
| 6,730,575 B2 | 5/2004 | Eldridge |
| 6,746,930 B2 | 6/2004 | Yang et al. |
| 6,750,066 B1 | 6/2004 | Cheung et al. |
| 6,754,108 B2 | 6/2004 | Forbes |
| 6,756,292 B2 | 6/2004 | Lee et al. |
| 6,767,582 B1 | 7/2004 | Elers |
| 6,767,795 B2 | 7/2004 | Ahn et al. |
| 6,770,536 B2 | 8/2004 | Wilk et al. |
| 6,774,050 B2 | 8/2004 | Ahn et al. |
| 6,777,353 B2 | 8/2004 | Putkonen |
| 6,778,441 B2 | 8/2004 | Forbes et al. |
| 6,780,704 B1 | 8/2004 | Raaijmakers et al. |
| 6,784,049 B2 | 8/2004 | Vaartstra |
| 6,784,101 B1 | 8/2004 | Yu et al. |
| 6,784,508 B2 | 8/2004 | Tsunashima et al. |
| 6,787,370 B2 | 9/2004 | Forbes |
| 6,787,413 B2 | 9/2004 | Ahn |
| 6,790,791 B2 | 9/2004 | Ahn et al. |
| 6,794,709 B2 | 9/2004 | Ahn et al. |
| 6,800,567 B2 | 10/2004 | Cho |
| 6,803,326 B2 | 10/2004 | Ahn et al. |
| 6,806,211 B2 | 10/2004 | Shinriki et al. |
| 6,812,100 B2 | 11/2004 | Ahn et al. |
| 6,812,157 B1 | 11/2004 | Gadgil |
| 6,821,862 B2 | 11/2004 | Cho |
| 6,821,873 B2 | 11/2004 | Visokay et al. |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,844,203 B2 | 1/2005 | Ahn et al. |
| 6,844,604 B2 | 1/2005 | Lee et al. |
| 6,852,167 B2 | 2/2005 | Ahn |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,884,719 B2 | 4/2005 | Chang et al. |
| 6,884,739 B2 | 4/2005 | Ahn et al. |
| 6,887,758 B2 | 5/2005 | Chindalore et al. |
| 6,893,984 B2 | 5/2005 | Ahn et al. |
| 6,900,122 B2 | 5/2005 | Ahn et al. |
| 6,900,481 B2 | 5/2005 | Jin et al. |
| 6,914,800 B2 | 7/2005 | Ahn et al. |
| 6,921,702 B2 | 7/2005 | Ahn et al. |
| 6,930,346 B2 | 8/2005 | Ahn et al. |
| 6,953,730 B2 | 10/2005 | Ahn et al. |
| 6,958,302 B2 | 10/2005 | Ahn et al. |
| 6,960,538 B2 | 11/2005 | Ahn et al. |
| 6,967,154 B2 | 11/2005 | Meng et al. |
| 6,970,053 B2 | 11/2005 | Akram et al. |
| 6,979,855 B2 | 12/2005 | Ahn et al. |
| 6,984,591 B1 | 1/2006 | Buchanan et al. |
| 6,989,565 B1 | 1/2006 | Aronowitz et al. |
| 6,989,573 B2 | 1/2006 | Ahn et al. |
| 7,026,694 B2 | 4/2006 | Ahn et al. |
| 7,037,574 B2 | 5/2006 | Paranjpe et al. |
| 7,045,430 B2 | 5/2006 | Ahn et al. |
| 7,049,192 B2 | 5/2006 | Ahn et al. |
| 7,064,058 B2 | 6/2006 | Ahn et al. |
| 7,068,544 B2 | 6/2006 | Forbes et al. |
| 7,081,421 B2 | 7/2006 | Ahn et al. |
| 7,084,078 B2 | 8/2006 | Ahn et al. |
| 7,101,813 B2 * | 9/2006 | Ahn et al. ............... 438/778 |
| 7,115,166 B2 | 10/2006 | Vaartstra et al. |
| 7,115,528 B2 | 10/2006 | Vaartstra et al. |
| 7,115,566 B2 | 10/2006 | Bodor et al. |
| 7,122,415 B2 | 10/2006 | Jang et al. |
| 7,122,464 B2 | 10/2006 | Vaartstra |
| 7,125,815 B2 | 10/2006 | Vaartstra |
| 7,129,553 B2 | 10/2006 | Ahn et al. |
| 7,135,369 B2 | 11/2006 | Ahn et al. |
| 7,135,421 B2 | 11/2006 | Ahn et al. |
| 7,138,681 B2 | 11/2006 | Forbes et al. |
| 7,141,278 B2 | 11/2006 | Koh et al. |
| 7,151,294 B2 | 12/2006 | Forbes et al. |
| 7,160,577 B2 | 1/2007 | Ahn et al. |
| 7,160,817 B2 | 1/2007 | Marsh |
| 7,164,168 B2 | 1/2007 | Forbes et al. |
| 7,169,673 B2 | 1/2007 | Ahn et al. |
| 7,183,186 B2 | 2/2007 | Ahn et al. |
| 7,190,020 B2 | 3/2007 | Forbes et al. |
| 7,192,824 B2 | 3/2007 | Ahn et al. |
| 7,192,892 B2 | 3/2007 | Ahn et al. |
| 7,195,999 B2 | 3/2007 | Forbes et al. |
| 7,196,007 B2 | 3/2007 | Vaartstra |
| 7,199,023 B2 | 4/2007 | Ahn et al. |
| 7,205,218 B2 | 4/2007 | Ahn et al. |
| 7,205,620 B2 | 4/2007 | Ahn et al. |
| 7,208,804 B2 | 4/2007 | Ahn et al. |
| 7,211,492 B2 | 5/2007 | Forbes et al. |
| 7,214,994 B2 | 5/2007 | Forbes et al. |
| 7,221,018 B2 | 5/2007 | Forbes |
| 7,235,501 B2 | 6/2007 | Ahn et al. |
| 7,235,854 B2 | 6/2007 | Ahn et al. |
| 7,250,367 B2 | 7/2007 | Vaartstra et al. |
| 7,253,122 B2 | 8/2007 | Vaartstra |
| 7,259,434 B2 | 8/2007 | Ahn et al. |
| 7,271,077 B2 | 9/2007 | Marsh et al. |
| 7,294,556 B2 | 11/2007 | Vaartstra |
| 7,300,870 B2 | 11/2007 | Vaartstra |
| 7,332,442 B2 | 2/2008 | Vaartstra et al. |
| 7,339,228 B2 | 3/2008 | Forbes et al. |
| 7,365,027 B2 | 4/2008 | Ahn et al. |
| 7,368,402 B2 | 5/2008 | Vaartstra et al. |
| 7,369,435 B2 | 5/2008 | Forbes |
| 7,374,617 B2 | 5/2008 | Vaartstra |
| 7,374,964 B2 | 5/2008 | Ahn et al. |
| 7,388,246 B2 | 6/2008 | Ahn et al. |
| 7,388,251 B2 | 6/2008 | Forbes et al. |
| 7,390,756 B2 | 6/2008 | Ahn et al. |
| 7,393,736 B2 | 7/2008 | Ahn et al. |
| 7,402,876 B2 | 7/2008 | Ahn et al. |
| 7,405,454 B2 | 7/2008 | Ahn et al. |
| 7,410,668 B2 | 8/2008 | Ahn |
| 7,410,910 B2 | 8/2008 | Ahn et al. |
| 7,410,917 B2 | 8/2008 | Ahn et al. |
| 7,410,918 B2 | 8/2008 | Vaartstra |
| 7,411,237 B2 | 8/2008 | Ahn et al. |
| 7,423,311 B2 | 9/2008 | Ahn et al. |
| 7,427,536 B2 | 9/2008 | Forbes et al. |
| 7,429,515 B2 | 9/2008 | Ahn et al. |
| 7,439,194 B2 | 10/2008 | Ahn et al. |
| 7,473,956 B2 | 1/2009 | Eldridge et al. |
| 7,479,428 B2 | 1/2009 | Forbes |
| 7,494,939 B2 | 2/2009 | Ahn et al. |
| 7,510,983 B2 | 3/2009 | Ahn et al. |
| 7,531,869 B2 | 5/2009 | Ahn et al. |
| 7,550,341 B2 | 6/2009 | Forbes et al. |
| 7,605,030 B2 | 10/2009 | Forbes et al. |
| 7,611,959 B2 | 11/2009 | Ahn et al. |
| 2001/0002280 A1 | 5/2001 | Sneh |
| 2001/0005625 A1 | 6/2001 | Sun et al. |
| 2001/0009695 A1 | 7/2001 | Saanila et al. |
| 2001/0012698 A1 | 8/2001 | Hayashi et al. |
| 2001/0014526 A1 | 8/2001 | Clevenger et al. |
| 2001/0019876 A1 | 9/2001 | Juengling et al. |
| 2001/0024387 A1 | 9/2001 | Raaijmakers et al. |
| 2001/0030352 A1 | 10/2001 | Ruf et al. |
| 2001/0034117 A1 | 10/2001 | Eldridge et al. |
| 2001/0042505 A1 | 11/2001 | Vaartstra |
| 2001/0050438 A1 | 12/2001 | Juengling et al. |
| 2002/0000593 A1 | 1/2002 | Nishiyama et al. |
| 2002/0001971 A1 | 1/2002 | Cho |
| 2002/0004276 A1 | 1/2002 | Ahn et al. |
| 2002/0004277 A1 | 1/2002 | Ahn et al. |
| 2002/0014647 A1 * | 2/2002 | Seidl et al. ............... 257/301 |
| 2002/0019125 A1 | 2/2002 | Juengling et al. |
| 2002/0024080 A1 | 2/2002 | Derderian et al. |
| 2002/0024108 A1 | 2/2002 | Lucovsky et al. |
| 2002/0025628 A1 | 2/2002 | Derderian et al. |
| 2002/0037603 A1 | 3/2002 | Eldridge et al. |
| 2002/0046705 A1 | 4/2002 | Sandhu et al. |
| 2002/0048910 A1 | 4/2002 | Taylor et al. |

| | | | | | |
|---|---|---|---|---|---|
| 2002/0053869 A1 | 5/2002 | Ahn et al. | 2003/0235064 A1 | 12/2003 | Batra et al. |
| 2002/0068466 A1 | 6/2002 | Lee et al. | 2003/0235961 A1 | 12/2003 | Metzner et al. |
| 2002/0083464 A1 | 6/2002 | Tomsen et al. | 2004/0004244 A1 | 1/2004 | Ahn et al. |
| 2002/0086507 A1 | 7/2002 | Park et al. | 2004/0004245 A1 | 1/2004 | Forbes et al. |
| 2002/0086555 A1 | 7/2002 | Ahn et al. | 2004/0004247 A1 | 1/2004 | Forbes et al. |
| 2002/0089023 A1 | 7/2002 | Yu et al. | 2004/0004859 A1 | 1/2004 | Forbes et al. |
| 2002/0094632 A1 | 7/2002 | Agarwal et al. | 2004/0009678 A1 | 1/2004 | Asai et al. |
| 2002/0100418 A1 | 8/2002 | Sandhu et al. | 2004/0009679 A1 | 1/2004 | Yeo et al. |
| 2002/0102818 A1 | 8/2002 | Sandhu et al. | 2004/0013009 A1 | 1/2004 | Tsunoda et al. |
| 2002/0110991 A1 | 8/2002 | Li | 2004/0016944 A1 | 1/2004 | Ahn et al. |
| 2002/0111001 A1 | 8/2002 | Ahn | 2004/0033681 A1 | 2/2004 | Ahn et al. |
| 2002/0117704 A1 | 8/2002 | Gonzalez | 2004/0033701 A1 | 2/2004 | Ahn et al. |
| 2002/0122885 A1 | 9/2002 | Ahn | 2004/0038525 A1 | 2/2004 | Meng et al. |
| 2002/0130338 A1 | 9/2002 | Ahn et al. | 2004/0038554 A1 | 2/2004 | Ahn |
| 2002/0135048 A1 | 9/2002 | Ahn et al. | 2004/0040494 A1 | 3/2004 | Vaartstra et al. |
| 2002/0145845 A1 | 10/2002 | Hunt et al. | 2004/0040501 A1 | 3/2004 | Vaartstra |
| 2002/0146916 A1 | 10/2002 | Irino et al. | 2004/0043151 A1 | 3/2004 | Vaartstra |
| 2002/0155688 A1 | 10/2002 | Ahn | 2004/0043541 A1 | 3/2004 | Ahn et al. |
| 2002/0155689 A1 | 10/2002 | Ahn | 2004/0043557 A1 | 3/2004 | Haukka et al. |
| 2002/0164420 A1 | 11/2002 | Derderian et al. | 2004/0043569 A1 | 3/2004 | Ahn et al. |
| 2002/0167057 A1 | 11/2002 | Ahn et al. | 2004/0043600 A1 | 3/2004 | Vaartstra |
| 2002/0170671 A1 | 11/2002 | Matsushita et al. | 2004/0043604 A1 | 3/2004 | Vaartstra |
| 2002/0176989 A1 | 11/2002 | Knudsen et al. | 2004/0043625 A1 | 3/2004 | Vaartstra et al. |
| 2002/0177244 A1 | 11/2002 | Hsu et al. | 2004/0043630 A1 | 3/2004 | Vaartstra et al. |
| 2002/0190294 A1 | 12/2002 | Iizuka et al. | 2004/0043632 A1 | 3/2004 | Vaartstra |
| 2002/0192974 A1 | 12/2002 | Ahn et al. | 2004/0043633 A1 | 3/2004 | Vaartstra |
| 2002/0192975 A1 | 12/2002 | Ahn | 2004/0043634 A1 | 3/2004 | Vaartstra |
| 2002/0192979 A1 | 12/2002 | Ahn | 2004/0043635 A1 | 3/2004 | Vaartstra |
| 2002/0195056 A1 | 12/2002 | Sandhu et al. | 2004/0043636 A1 | 3/2004 | Vaartstra et al. |
| 2002/0197793 A1 | 12/2002 | Dornfest et al. | 2004/0065255 A1 | 4/2004 | Yang et al. |
| 2002/0197881 A1 | 12/2002 | Ramdani et al. | 2004/0092073 A1 | 5/2004 | Cabral, Jr. et al. |
| 2003/0001190 A1 | 1/2003 | Basceri et al. | 2004/0094801 A1 | 5/2004 | Liang et al. |
| 2003/0003635 A1 | 1/2003 | Paranjpe et al. | 2004/0104439 A1 | 6/2004 | Haukka et al. |
| 2003/0003702 A1 | 1/2003 | Ahn | 2004/0106249 A1 | 6/2004 | Huotari |
| 2003/0003722 A1 | 1/2003 | Vaartstra | 2004/0110348 A1 | 6/2004 | Ahn et al. |
| 2003/0003730 A1 | 1/2003 | Li | 2004/0110391 A1 | 6/2004 | Ahn et al. |
| 2003/0017717 A1 | 1/2003 | Ahn | 2004/0126954 A1 | 7/2004 | Marsh et al. |
| 2003/0027360 A1 | 2/2003 | Hsu et al. | 2004/0135186 A1 | 7/2004 | Yamamoto |
| 2003/0032270 A1 | 2/2003 | Snyder et al. | 2004/0144980 A1 | 7/2004 | Ahn et al. |
| 2003/0040196 A1 | 2/2003 | Lim et al. | 2004/0152254 A1 | 8/2004 | Vaartstra et al. |
| 2003/0043637 A1 | 3/2003 | Forbes et al. | 2004/0159863 A1 | 8/2004 | Eldridge et al. |
| 2003/0045060 A1 | 3/2003 | Ahn et al. | 2004/0164357 A1 | 8/2004 | Ahn et al. |
| 2003/0045078 A1 | 3/2003 | Ahn et al. | 2004/0164365 A1 | 8/2004 | Ahn et al. |
| 2003/0045082 A1 | 3/2003 | Eldridge et al. | 2004/0169453 A1 | 9/2004 | Ahn et al. |
| 2003/0048666 A1 | 3/2003 | Eldridge et al. | 2004/0171280 A1 | 9/2004 | Conley, Jr. et al. |
| 2003/0049942 A1 | 3/2003 | Haukka et al. | 2004/0175882 A1 | 9/2004 | Ahn et al. |
| 2003/0059535 A1 | 3/2003 | Luo et al. | 2004/0178439 A1 | 9/2004 | Ahn et al. |
| 2003/0062261 A1 | 4/2003 | Shindo | 2004/0183108 A1 | 9/2004 | Ahn |
| 2003/0064607 A1 | 4/2003 | Leu et al. | 2004/0185654 A1 | 9/2004 | Ahn |
| 2003/0068848 A1 | 4/2003 | Hsu et al. | 2004/0187968 A1 | 9/2004 | Vaartstra |
| 2003/0104666 A1 | 6/2003 | Bojarczuk, Jr. et al. | 2004/0189175 A1 | 9/2004 | Ahn et al. |
| 2003/0119246 A1 | 6/2003 | Ahn | 2004/0196620 A1 | 10/2004 | Knudsen et al. |
| 2003/0119291 A1 | 6/2003 | Ahn et al. | 2004/0197946 A1 | 10/2004 | Vaartstra et al. |
| 2003/0124748 A1 | 7/2003 | Summerfelt et al. | 2004/0198069 A1 | 10/2004 | Metzner et al. |
| 2003/0124791 A1 | 7/2003 | Summerfelt et al. | 2004/0206957 A1 | 10/2004 | Inoue et al. |
| 2003/0132491 A1 | 7/2003 | Ahn | 2004/0214399 A1 | 10/2004 | Ahn et al. |
| 2003/0139039 A1 | 7/2003 | Ahn et al. | 2004/0219746 A1 | 11/2004 | Vaartstra et al. |
| 2003/0143801 A1 | 7/2003 | Basceri et al. | 2004/0222476 A1 | 11/2004 | Ahn et al. |
| 2003/0157764 A1 | 8/2003 | Ahn et al. | 2004/0248398 A1 | 12/2004 | Ahn et al. |
| 2003/0170389 A1 | 9/2003 | Sandhu | 2004/0262700 A1 | 12/2004 | Ahn et al. |
| 2003/0170450 A1 | 9/2003 | Stewart et al. | 2005/0009266 A1 | 1/2005 | Vaartstra |
| 2003/0175411 A1 | 9/2003 | Kodas et al. | 2005/0009335 A1 | 1/2005 | Dean et al. |
| 2003/0176065 A1 | 9/2003 | Vaartstra | 2005/0009368 A1 | 1/2005 | Vaartstra |
| 2003/0181039 A1 | 9/2003 | Sandhu et al. | 2005/0009370 A1 | 1/2005 | Ahn |
| 2003/0181060 A1 | 9/2003 | Asai et al. | 2005/0019978 A1 | 1/2005 | Vaartstra et al. |
| 2003/0183156 A1 | 10/2003 | Dando et al. | 2005/0020017 A1 | 1/2005 | Ahn et al. |
| 2003/0200917 A1 | 10/2003 | Vaartstra | 2005/0023574 A1 | 2/2005 | Forbes et al. |
| 2003/0205742 A1 | 11/2003 | Hsu et al. | 2005/0023584 A1 | 2/2005 | Derderian et al. |
| 2003/0205774 A1 | 11/2003 | Hokazono | 2005/0023594 A1 | 2/2005 | Ahn et al. |
| 2003/0207032 A1 | 11/2003 | Ahn et al. | 2005/0023603 A1 | 2/2005 | Eldridge et al. |
| 2003/0207540 A1 | 11/2003 | Ahn et al. | 2005/0023624 A1 | 2/2005 | Ahn et al. |
| 2003/0207564 A1 | 11/2003 | Ahn et al. | 2005/0023625 A1 | 2/2005 | Ahn et al. |
| 2003/0207593 A1 | 11/2003 | Derderian et al. | 2005/0023626 A1 | 2/2005 | Ahn et al. |
| 2003/0213987 A1 | 11/2003 | Basceri | 2005/0023627 A1 | 2/2005 | Ahn et al. |
| 2003/0216038 A1 | 11/2003 | Madhukar et al. | 2005/0026374 A1 | 2/2005 | Ahn et al. |
| 2003/0222300 A1 | 12/2003 | Basceri et al. | 2005/0028733 A1 | 2/2005 | Vaartstra |
| 2003/0227033 A1 | 12/2003 | Ahn et al. | 2005/0029547 A1 | 2/2005 | Ahn et al. |
| 2003/0228747 A1 | 12/2003 | Ahn et al. | 2005/0029604 A1 | 2/2005 | Ahn et al. |
| 2003/0232511 A1 | 12/2003 | Metzner et al. | 2005/0029605 A1 | 2/2005 | Ahn et al. |

| | | |
|---|---|---|
| 2005/0030825 A1 | 2/2005 | Ahn |
| 2005/0032292 A1 | 2/2005 | Ahn et al. |
| 2005/0032360 A1 | 2/2005 | Vaartstra |
| 2005/0034662 A1 | 2/2005 | Ahn |
| 2005/0037563 A1 | 2/2005 | Ahn |
| 2005/0054165 A1 | 3/2005 | Ahn et al. |
| 2005/0077519 A1 | 4/2005 | Ahn et al. |
| 2005/0087134 A1 | 4/2005 | Ahn |
| 2005/0112874 A1 | 5/2005 | Skarp et al. |
| 2005/0124171 A1 | 6/2005 | Vaartstra |
| 2005/0124174 A1 | 6/2005 | Ahn et al. |
| 2005/0124175 A1 | 6/2005 | Ahn et al. |
| 2005/0136689 A9 | 6/2005 | Vaartstra |
| 2005/0138262 A1 | 6/2005 | Forbes |
| 2005/0145957 A1 | 7/2005 | Ahn et al. |
| 2005/0145959 A1 | 7/2005 | Forbes |
| 2005/0151184 A1 | 7/2005 | Lee et al. |
| 2005/0158973 A1 | 7/2005 | Ahn et al. |
| 2005/0160981 A9 | 7/2005 | Vaartstra et al. |
| 2005/0173755 A1 | 8/2005 | Forbes |
| 2005/0212119 A1 | 9/2005 | Shero et al. |
| 2005/0215015 A1 | 9/2005 | Ahn et al. |
| 2005/0218462 A1 | 10/2005 | Ahn et al. |
| 2005/0221006 A1 | 10/2005 | Vaartstra |
| 2005/0227442 A1 | 10/2005 | Ahn et al. |
| 2005/0275011 A1 | 12/2005 | Forbes |
| 2005/0277243 A1 | 12/2005 | Forbes |
| 2005/0277256 A1 | 12/2005 | Ahn et al. |
| 2005/0280067 A1 | 12/2005 | Ahn et al. |
| 2005/0285225 A1 | 12/2005 | Ahn et al. |
| 2005/0287804 A1 | 12/2005 | Vaartstra |
| 2005/0287819 A1 | 12/2005 | Vaartstra et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0019453 A1 | 1/2006 | Forbes |
| 2006/0023513 A1 | 2/2006 | Forbes et al. |
| 2006/0024975 A1 | 2/2006 | Ahn et al. |
| 2006/0028867 A1 | 2/2006 | Forbes et al. |
| 2006/0028869 A1 | 2/2006 | Forbes et al. |
| 2006/0033144 A1 | 2/2006 | Forbes et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0125030 A1 | 6/2006 | Ahn et al. |
| 2006/0128168 A1 | 6/2006 | Ahn et al. |
| 2006/0145241 A1 | 7/2006 | Forbes et al. |
| 2006/0148180 A1 | 7/2006 | Ahn et al. |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0180876 A1 | 8/2006 | Forbes et al. |
| 2006/0183271 A1 | 8/2006 | Forbes et al. |
| 2006/0183272 A1 | 8/2006 | Ahn et al. |
| 2006/0189154 A1 | 8/2006 | Ahn et al. |
| 2006/0208309 A1 | 9/2006 | Forbes et al. |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0237764 A1 | 10/2006 | Ahn et al. |
| 2006/0237768 A1 | 10/2006 | Forbes et al. |
| 2006/0244082 A1 | 11/2006 | Ahn et al. |
| 2006/0244100 A1 | 11/2006 | Ahn et al. |
| 2006/0245255 A1 | 11/2006 | Forbes et al. |
| 2006/0245984 A1 | 11/2006 | Kulkarni et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0258175 A1 | 11/2006 | Vaartstra et al. |
| 2006/0261389 A1 | 11/2006 | Vaartstra |
| 2006/0261397 A1 | 11/2006 | Ahn et al. |
| 2006/0263972 A1 | 11/2006 | Ahn et al. |
| 2006/0264064 A1 | 11/2006 | Ahn et al. |
| 2006/0270147 A1 | 11/2006 | Ahn et al. |
| 2006/0281330 A1 | 12/2006 | Ahn et al. |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0020835 A1 | 1/2007 | Ahn et al. |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0048926 A1 | 3/2007 | Ahn |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0107661 A1 | 5/2007 | Ahn |
| 2007/0111544 A1 | 5/2007 | Ahn |
| 2007/0131169 A1 | 6/2007 | Ahn |
| 2007/0134931 A1 | 6/2007 | Ahn et al. |
| 2007/0134942 A1 | 6/2007 | Ahn et al. |
| 2007/0141832 A1 | 6/2007 | Farrar |
| 2007/0144438 A1 | 6/2007 | Vaartstra |
| 2007/0155190 A1 | 7/2007 | Vaartstra et al. |
| 2007/0158765 A1 | 7/2007 | Ahn et al. |
| 2007/0161260 A1 | 7/2007 | Vaartstra |
| 2007/0166999 A1 | 7/2007 | Vaartstra |
| 2007/0181931 A1 | 8/2007 | Ahn et al. |
| 2007/0187772 A1 | 8/2007 | Ahn et al. |
| 2007/0187831 A1 | 8/2007 | Ahn et al. |
| 2007/0234949 A1 | 10/2007 | Ahn et al. |
| 2007/0295273 A1 | 12/2007 | Vaartstra |
| 2008/0029790 A1 | 2/2008 | Ahn et al. |
| 2008/0032424 A1 | 2/2008 | Ahn et al. |
| 2008/0032465 A1 | 2/2008 | Ahn et al. |
| 2008/0048225 A1 | 2/2008 | Ahn et al. |
| 2008/0057659 A1 | 3/2008 | Forbes et al. |
| 2008/0064210 A1 | 3/2008 | Vaartstra |
| 2008/0087890 A1 | 4/2008 | Ahn et al. |
| 2008/0102629 A1 | 5/2008 | Vaartstra |
| 2008/0112228 A1 | 5/2008 | Forbes et al. |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0217676 A1 | 9/2008 | Ahn et al. |
| 2008/0224240 A1 | 9/2008 | Ahn et al. |
| 2008/0274625 A1 | 11/2008 | Ahn et al. |
| 2008/0283940 A1 | 11/2008 | Ahn et al. |
| 2009/0032910 A1 | 2/2009 | Ahn et al. |
| 2009/0191676 A1 | 7/2009 | Forbes |
| 2009/0218611 A1 | 9/2009 | Forbes et al. |
| 2010/0035749 A1 | 2/2010 | Choi et al. |

FOREIGN PATENT DOCUMENTS

| | | |
|---|---|---|
| JP | 03028162 | 2/1991 |
| JP | 2001-332546 | 11/2001 |
| WO | WO-02/31875 A2 | 4/2002 |
| WO | WO-02/43115 A2 | 5/2002 |

OTHER PUBLICATIONS

Aarik, J., et al., "Phase transformations in hafnium dioxide thin films grown by atomic layer deposition at high temperatures", *Applied Surface Science*, 173(1-2), (Mar. 2001), 15-21.

Aarik, J., et al., "Texture development in nanocrystalline hafnium dioxide thin films grown by atomic layer deposition", *Journal of Crystal Growth*, 220(1-2), (Nov. 15, 2000), 105-113.

Alén, P., et al., "Atomic Layer deposition of Ta(Al)N(C) thin films using trimethylaluminum as a reducing agent", *Journal of the Electrochemical Society*, 148(10), (Oct. 2001), G566-G571.

Bright, A. A., et al., "Low-rate plasma oxidation of Si in a dilute oxygen/helium plasma for low-temperature gate quality $Si/SiO_2$ interfaces", *Applied Physics Letters*, 58(6), (Feb. 1991), 619-621.

Chang, H. S., et al., "Excellent thermal stability of $Al_2O_3/ZrO_2/Al_2O_3$ stack structure of metal-oxide-semiconductor gate dielectrics application", *Applied Physics Letters*, 80(18), (May 6, 2002), 3385-3387.

Chen, P. J., et al., "Thermal stability and scalability of Zr-aluminate-based high-k gate stacks", *Symposium on VLSI Technology Digest*, (2002), 192-193.

Cheng, B., et al., "The Impact of High-κ Gate Dielectrics and Metal Gate Electrodes on Sub-100nm MOSFET's", *IEEE Transactions on Electron Devices*, 46(7) (Jul. 1999), 1537-1544.

Colombo, D., et al., "Anhydrous Metal Nitrates as Volatile Single Source Precursors for the CVD of Metal Oxide Films", *Communications, Department of EE, U of M, Mpls, MN*, Jul. 7, 1998, 3 pages.

Copel, M., et al., "Structure and stability of ultrathin zirconium oxide layers on Si(001)", *Applied Physics Letters*, 76(4), (Jan. 2000), 436-438.

Da Rosa, E. B..O., et al., "Annealing of $ZrAl_xO_y$ Ultrathin Films on Si in a Vacuum or in $O_2$", *Journal of the Electrochemical Society*, 148 (12), (Dec. 2001), G695-G703.

Desu, S. B., "Minimization of Fatigue in Ferroelectric Films", *Physica Status Solidi A*, 151(2), (1995), 467-480.

Dover, V., et al., "Deposition of Uniform Zr-Sn-Ti-O Films by On-Axis Reactive Sputtering", *IEEE Electron Device Letters*, vol. 19, No. 9, (Sep. 1998), 329-331.

Ducso, C, et al., "Deposition of tin oxide into porous silicon by atomic layer epitaxy", *Journal of the Electrochemical Society*, 143, (1996), 683-687.

Engelhardt, M., "Modern Applications of Plasma Etching and Patterning in Silicon Process Technology", *Contributions to Plasma Physics*, 39(5), (1999), 473-478.

Forsgren, K., "Atomic Layer Deposition of $HfO_2$ using hafnium iodide", *Conference held in Monterey, California*, (May 2001), 1 page.

Fuyuki, T., et al., "Electronic Properties of the Interface between Si and $TiO_2$ Deposited at Very Low Temperatures", *Japanese Journal of Applied Physics, Part 1 (Regular Papers & Short Notes)*, 25(9), (Sep. 1986), 1288-1291.

Fuyuki, T., et al., "Initial stage of ultra-thin $SiO_2$ formation at low temperatures using activated oxygen", *Applied Surface Science*, 117-118, (Jun. 1997), 123-126.

Gartner, M, "Spectroellipsometric characterization of lanthanide-doped $TiO_2$ films obtained via the sol-gel technique", *Thin Solid Films*, 234(1-2), (1993), 561-565.

Geller, S., et al., "Crystallographic Studies of Perovskite-like Compounds. II. Rare Earth Aluminates", *Acta Cryst.*, 9, (May 1956), 1019-1025.

Giess, E. A., et al., "Lanthanide gallate perovskite-type substrates for epitaxial, high-$T_c$ superconducting $Ba_2YCu_3O_7-\delta$ films", *IBM Journal of Research and Development*, 34(6), (Nov. 1990), 916-926.

Gusev, E P, "Ultrathin High-K Dielectrics Grown by Atomic Layer Deposition: A Comparative Study of $ZrO_2$, $HfO_2$, $Y_2O_3$ and $Al_2O_3$", *Electrochemical Society Proceedings* vol. 2001-9, (2001), 189-195.

Gutowski, M. J., "Thermodynamic stability of high-K dielectric metal oxides $ZrO_2$ and $HfO_2$ in contact with Si and $SiO_2$", *Applied Physics Letters*, 80(11), (Mar. 18, 2002), 1897-1899.

Hirayama, M., et al., "Low-Temperature Growth of High-Integrity Silicon Oxide Films by Oxygen by Radical Generated in High Density Krypton Plasma", *International Electron Devices Meeting 1999. Technical Digest*, (1999), 249-252.

Hubbard, K. J., et al., "Thermodynamic stability of binary oxides in contact with silicon", *Journal of Materials Research*, 11(11), (Nov. 1996), 2757-2776.

Hunt, C. E., et al., "Direct bonding of micromachined silicon wafers for laser diode heat exchanger applications", *Journal of Micromechanics and Microengineering*, 1(3), (Sep. 1991), 152-156.

Iddles, D. M et al., "Relationships between dopants, microstructure and the microwave dielectric properties of $ZrO_2$-$TiO_2$-$SnO_2$ ceramics", *Journal of Materials Science*, 27(23), (Dec. 1992), 6303-6310.

Jeon, S., et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001), 471-474.

Jeon, S., et al., "Ultrathin nitrided-nanolaminate ($Al_2O_3/ZrO_2/Al_2O_3$) for metal-oxide-semiconductor gate dielectric applications", *Journal of Vacuum Science & Technology B: Microelectronics and Nanometer Structures*, 20(3), (May 2002), 1143-5.

Jeong, Chang-Wook, "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001), 285-289.

Kawai, Y, et al., "Ultra-low-temperature growth of high-integrity gate oxide films by low-energy Ion-assisted oxidation", Applied Physics Letters, 64(17), (Apr. 1994), 2223-2225.

Keomany, D., et al., "Sol gel preparation of mixed cerium-titanium oxide thin films", *Solar Energy Materials and Solar Cells*, 33(4), (Aug. 1994), 429-441.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001), pp. 7.8.1-7.8.6.

Kim, C. T., "Application of Al2O3 Grown by Atomic Layer Deposition to DRAM and FeRAM", *12th International Symposium in Integrated Ferroelectrics*, (Mar. 2000), p. 316.

Kim, D., et al., "Atomic Control of Substrate Termination and Heteroepitaxial Growth of $SrTiO_3/LaAlO_3$ Films", *Journal of the Korean Physical Society*, 36(6), (Jun. 2000), 444-448.

Kim, T., et al., "Correlation between strain and dielectric properties in $ZrTiO_4$ thin films", *Applied Physics Letters*, 76(21), (May 2000), 3043-3045.

Kim, T., et al., "Dielectric properties and strain analysis in paraelectric $ZrTiO_4$ thin films deposited by DC magnetron sputtering", *Japanese Journal of Applied Physics Part 1—Regular Papers Short Notes & Review Papers*, 39(7A), (2000), 4153-4157.

Kim, Y, et al., "Substrate dependence on the optical properties of $Al_2O_3$ films grown by atomic layer deposition", *Applied Physics Letters*, 71(25), (Dec. 22, 1997), 3604-3606.

Kim, Yongjo, et al., "Effect of microstructures on the microwave dielectric properties of $ZrTiO_4$ thin films", *Applied Physics Letters*, 78(16), (Apr. 16, 2001), 2363-2365.

Krauter, G., et al., "Room Temperature Silicon Wafer Bonding with Ultra-Thin Polymer Films", *Advanced Materials*, 9(5), (1997), 417-420.

Kukli, K J, et al., "Properties of hafnium oxide films grown by atomic layer deposition from hafnium tetraiodide and oxygen", *Journal of Applied Physics*, 92(10), (Nov. 15, 2002), 5698-5703.

Kukli, K., et al., "Controlled growth of yttrium oxysulphide thin films by atomic layer deposition", *Materials Science Forum*, 315-317, (1999), 216-221.

Kukli, K., "Atomic Layer Deposition of Titanium Oxide $TiI_4$ and $H_2O_2$", *Chemical Vapor Deposition*, 6(6), (2000), 303-310.

Kukli, K., "Comparison of hafnium oxide films grown by atomic layer deposition from iodide and chloride precursors", *Thin Solid Films*, 416, (2002), 72-79.

Kukli, K., et al., "Dielectric Properties of Zirconium Oxide Grown by Atomic Layer Deposition from Iodide Precursor", *Journal of the Electrochemical Society*, 148(12), (2001), F227-F232.

Kukli, K., et al., "Influence of thickness and growth temperature on the properties of zirconium oxide films growth by atomic layer deposition on silicon", *Thin Solid Films*, 410(1-2), (2002), 53-60.

Kukli, K., "Low-Temperature Deposition of Zirconium Oxide-Based Nanocrystalline Films by Alternate Supply of $Zr[OC(CH_3)_3]_4$ and $H_2O$", *Chemical Vapor Deposition*, 6(6), (2000), 297-302.

Lee, A. E., et al., "Epitaxially grown sputtered $LaAlO_3$ films", *Applied Physics Letters*, 57(19), (Nov. 1990), 2019-2021.

Lee, B. H., et al., "Ultrathin Hafnium Oxide with Low Leakage and excellent Reliability for Alternative Gate Dielectric Application", *IEEE Technical Digest of International Electron Devices Meeting 1999*, (1999), 133-136.

Lee, C. H., et al., "MOS Devices with High Quality Ultra Thin CVD ZrO$_2$ Gate Dielectrics and Self-Aligned TaN and TaN/Poly-Si Gate electrodes", *2001 Symposium on VLSI, Technology Digest of Technical Papers*, (2001), 137-138.

Lee, C. H., "MOS Characteristics of Ultra Thin Rapid Thermal CVD ZrO$_2$ and Zr Silicate Gate Dielectrics", *Electron Devices Meeting, 2000. IEDM Technical Digest. International*, (2000), 27-30.

Lee, Cheng-Chung, et al., "Ion-assisted deposition of silver thin films", *Thin Solid Films*, 359(1), (Jan. 2000), 95-97.

Lee, D. H., et al., "Metalorganic chemical vapor deposition of TiO$_2$:N anatase thin film on Si substrate", *Appl. Phys. Lett.*, 66(7), (Feb. 1995), 815-816.

Lee, L. P., et al., "Monolithic 77 K dc SQUID magnetometer", *Applied Physics Letters*, 59(23), (Dec. 1991), 3051-3053.

Leskela, M., "ALD precursor chemistry: Evolution and future challenges", *Journal de Physique IV (Proceedings)*, 9(8), (Sep. 1999), 837-852.

Liu, C. T., "Circuit Requirement and Integration Challenges of Thin Gate Dielectrics for Ultra Small MOSFETs", *International Electron Devices Meeting 1998. Technical Digest*, (1998), 747-750.

Liu, Y. C., et al., "Growth of ultrathin SiO$_2$ on Si by surface irradiation with an O$_2$+Ar electron cyclotron resonance microwave plasma at low temperatures", *Journal of Applied Physics*, 85(3), (Feb. 1999), 1911-1915.

Lucovsky, G, et al., "Microscopic model for enhanced dielectric constants in low concentration SiO$_2$-rich noncrystalline Zr and Hf silicate alloys", *Applied Physics Letters*, 77(18), (Oct. 2000), 2912-2914.

Luo, Z J, et al, "Ultra-thin ZrO$_2$ (or Silicate) with High Thermal Stability for CMOS Gate Applications", *2001 Symposium on VLSI Technology Digest of Technical Papers*, (2001), 135-136.

Martin, P. J., et al., "Ion-beam-assisted deposition of thin films", *Applied Optics*, 22(1), (Jan. 1983), 178-184.

Molodyk, A. A., et al., "Volatile Surfactant-Assisted MOCVD: Application to LaAlO$_3$ Thin Film Growth", *Chemical Vapor Deposition*, 6(3), (Jun. 2000), 133-138.

Molsa, H., et al., "Growth of Yttrium Oxide Thin Films from β-Diketonate Precursor", *Advanced Materials for Optics and Electronics*, 4(6), (Nov.-Dec. 1994), 389-400.

Muller, D. A., et al., "The electronic structure at the atomic scale of ultrathin gate oxides", *Nature*, 399, (Jun. 24, 1999), 758-61.

Nakagawara, O., et al., "Electrical properties of (Zr, Sn)TiO$_4$ dielectric thin film prepared by pulsed laser deposition", *Journal of Applied Physics*, 80(1), (Jul. 1996), 388-392.

Nakajima, A., "Atomic-layer deposition of ZrO$_2$ with a Si nitride barrier layer", *Applied Physics Letters*, 81(15), (Oct. 2002), 2824-2826.

Nakajima, A., et al., "NH$_3$-annealed atomic-layer-deposited silicon nitride as a high-k gate dielectric with high reliability", *Applied Physics Letters*, 80(7), (Feb. 2002), 1252-1254.

Nalwa, H. S., "Handbook of Thin Film Materials", *Deposition and Processing of Thin Films*, vol. 1, San Diego : Academic Press, (2002), 114-119.

Neumayer, D. A., et al., "Materials characterization of ZrO$_2$—SiO$_2$ and HfO$_2$—SiO$_2$ binary oxides deposited by chemical solution deposition", *Journal of Applied Physics*, 90(4), (Aug. 15, 2001), 1801-1808.

Nieminen, M., et al., "Formation and stability of lanthanum oxide thin films deposited from β-diketonate precursor", *Applied Surface Science*, 174(2), (Apr. 16, 2001), 155-165.

Niilisk, A., "Atomic-scale optical monitoring of the initial growth of TiO$_2$ thin films", *Proceedings of the SPIE—The International Society for Optical Engineering*, 4318, (2001), 72-77.

Ohring, M., "The Materials Science of Thin Films", Boston : Academic Press, (1992), pp. 118,121,125.

Osten, H J, et al., "High-k Gate Dielectrics with Ultra-low Leakage Current Based on Praseodymium Oxide", *Technical Digest of IEDM*, (2000), 653-656.

Pan, T. M., et al., "High quality ultrathin CoTiO$_3$ high-k gate dielectrics", *Electrochemical and Solid-State Letters*, 3(9), (Sep. 2000), 433-434.

Pan, T. M., et al., "High-$k$ cobalt-titanium oxide dielectrics formed by oxidation of sputtered Co/Ti or Ti/Co films", *Applied Physics Letters*, 78(10), (Mar. 5, 2001), 1439-1441.

Park, Byung-Eun, et al., "Electrical properties of LaAlO$_3$/Si and Sr$_{0.8}$Bi$_{2.2}$Ta$_2$O$_9$/LaAlO$_3$/Si structures", *Applied Physics Letters*, 79(6), (Aug. 2001), 806-808.

Perkins, C. M., et al., "Electrical and materials properties of ZrO$_2$ gate dielectrics grown by atomic layer chemical vapor deposition", *Applied Physics Letters*, 78(16), (Apr. 2001), 2357-2359.

Qi, Wen-Jie, et al., "MOSCAP and MOSFET characteristics using ZrO$_2$ gate dielectric deposited directly on Si", *International Electron Devices Meeting 1999. Technical Digest*, (1999), 145-148.

Qi, Wen-Jie, et al., "Performance of MOSFETs with ultra thin ZrO$_2$ and Zr-silicate gate dielectrics", *2000 Symposium on VLSI Technology, Digest of Technical Papers*, (2000), 40-41.

Rahtu, A., "Atomic Layer Deposition of Zirconium Titanium Oxide from Titanium Isopropoxide and Zirconium Chloride", *Chemistry of Materials*, 13(5), (May 2001), 1528-1532.

Ramakrishnan, E. S., et al., "Dielectric properties of radio frequency magnetron sputter deposited zirconium titanate-based thin films", *Journal of the Electrochemical Society*, 145(1), (Jan. 1998), 358-362.

Rayner Jr., G, et al., "The structure of plasma-deposited and annealed pseudo-binary ZrO$_2$-SiO$_2$ alloys", *Materials Research Society Symposium—Proceedings*, 611, (2000), C131-C139.

Ritala, M., "Atomic layer deposition of oxide thin films with metal alkoxides as oxygen sources", *Science*, 288(5464), (Apr. 14, 2000), 319-321.

Ritala, M., "Atomic Layer Epitaxy Growth of Titanium, Zirconium and Hafnium Dioxide Thin Films", *Annales Academiae Scientiarum Fennicae*, (1994), 24-25.

Ritala, M., "Zirconium dioxide thin films deposited by ALE using zirconium tetrachloride as precursor", *Applied Surface Science*, 75, (Jan. 1994), 333-340.

Rossnagel, S. M., et al., "Plasma-enhanced atomic layer deposition of Ta and Ti for Interconnect diffusion barriers", *Journal of Vacuum Science & Technology B (Microelectronics and Nanometer Structures)*, 18(4), (Jul. 2000), 2016-2020.

Rotondaro, A. L., et al., "Advanced CMOS Transistors with a Novel HfSiON Gate Dielectric", *Symposium on VLSI Technology Digest of Technical Papers*, (2002), 148-149.

Saito, Y, et al., "High-Integrity Silicon Oxide Grown at Low-temperature by Atomic Oxygen Generated in High-Density Krypton Plasma", *Extended Abstracts of the 1999 International Conference on Solid State Devices and Materials*, (1999), 152-153.

Saito, Y., et al., "Advantage of Radical Oxidation for Improving Reliability of Ultra-Thin Gate Oxide", *2000 Symposium on VLSI Technology Digest of Technical Papers*, (2000), 176-177.

Shanware, A., et al., "Reliability evaluation of HfSiON gate dielectric film with 12.8 Å SiO$_2$ equivalent thickness", *International Electron Devices Meeting. Technical Digest*, (2001), pp. 6.6.1-6.6.4.

Shin, C. H., "Fabrication and Characterization of MFISFET Using Al$_2$O$_3$ Insulating Layer for Non-volatile Memory", *12th International Symposium in Integrated Ferroelectrics*, (Mar. 2000), 9 pgs.

Smith, R. C., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000), 105-114.

Sneh, O., "Thin film atomic layer deposition equipment for semiconductor processing", *Thin Solid Films*, 402, (2002), 248-261.

Song, Hyun-Jung, et al., "Atomic Layer Deposition of Ta$_2$O$_5$ Films Using Ta(OC$_2$H$_5$)$_5$ and NH$_3$", *Ultrathin SiO$_2$ and High-K Materials for ULSI Gate Dielectrics. Symposium*, (1999), 469-471.

Stathis, J. H., et al., "Reliability Projection for Ultra-Thin Oxides at Low Voltage", *Tech Dig. International Electron Device Meeting*, (1998), 167-169.

Suntola. T., "Atomic Layer Epitaxy", *Handbook of Crystal Growth, 3; Thin Films of Epitaxy, Part B: Growth Mechanics and Dynamics*, Amsterdam, (1994), 601-663.

Suntola, Tuomo, "Atomic layer epitaxy", *Thin Solid Films*, 216(1), (Aug. 28, 1992), 84-89.

Sze, S M, "Physics of Semiconductor Devices", *New York : Wiley*, (1981), p. 431.

Sze, S M, "Physics of Semiconductor Devices", *New York : Wiley*, (1981), p. 473.

Takemoto, J. H., et al., "Microstrip Resonators and Filters Using High-TC Superconducting Thin Films on LaAlO$_3$", *IEEE Transaction on Magnetics*, 27(2), (Mar. 1991), 2549-2552.

Tarre, A, et al., "Comparative study of low-temperature chloride atomic-layer chemical vapor deposition of TiO$_2$ and SnO$_2$", *Applied Surface Science*, 175-176, (May 2001), 111-116.

Van Dover, R. B., "Amorphous lanthanide-doped TiO$_x$ dielectric films", *Applied Physics Letters*, 74(20), (May 1999), 3041-3043.

Van Dover, R. B., et al., "Deposition of Uniform Zr-Sn-Ti-O Films by On-Axis Reactive Sputtering", *IEEE Electron Device Letters*, 19(9), (Sep. 1998), 329-331.

Van Dover, R. B., "Discovery of a useful thin-film dielectric using a composition-spread approach", *Nature*, 392, (Mar. 12, 1998), 162-164.

Viirola, H., et al., "Controlled growth of antimony-doped tin dioxide thin films by atomic layer epitaxy", *Thin Solid Films*, 251, (Nov. 1994), 127-135.

Viirola, H., et al., "Controlled growth of tin dioxide thin films by atomic layer epitaxy", *Thin Solid Films*, 249(2), (Sep. 1994), 144-149.

Visokay, M R, "Application of HfSiON as a gate dielectric material", *Applied Physics Letters*, 80(17), (Apr. 2002), 3183-3185.

Wilk, G D, et al., "Hafnium and zirconium silicates for advanced gate dielectrics", *Journal of Applied Physics*, 87(1), (Jan. 2000), 484-492.

Wilk, G. D., "High-K gate dielectrics: Current status and materials properties considerations", *Journal of Applied Physics*, 89(10), (May 2001), 5243-5275.

Wolf, S., et al., , *Silicon Processing for the VLSI Era—vol. 4: Deep-Submicron Process Technology*, Lattice Press, Sunset Beach, CA, (2002), pp. 98, 146 173-174.

Wolf, S., et al., "Silicon Processing for the VLSI Era—vol. I: Process Technology", *Second Edition, Lattice Press*, Sunset Beach, California, (2000), p. 443.

Wolfram, G, et al., "Existence range, structural and dielectric properties of Zr$_x$Ti$_y$Sn$_z$O$_4$ ceramics (x+y=2)", *Materials Research Bulletin*, 16(11), (Nov. 1981), 1455-1463.

Yamaguchi, T., et al., "Band Diagram and Carrier Conduction Mechanism in ZrO$_2$/Zr-silicate/Si MIS Structure Fabricated by Pulsed-laser-ablation Deposition", *Electron Devices Meeting, 2000. IEDM Technical Digest. International*, (2000), 19-22.

Yamaguchi, T., et al., "Study on Zr-Silicate Interfacial Layer of ZrO$_2$-MIS Structure Fabricated by Pulsed Laser Ablation Deposition Method", *Solid State Devices and Materials*, (2000), 228-229.

Zhang, H, et al., "High permitivity thin film nanolaminates", *Journal of Applied Physics*, 87(4), (Feb. 2000), 1921-1924.

Zhang, H., "Atomic Layer Deposition of High Dielectric Constant Nanolaminates", *Journal of the Electrochemical Society*, 148(4), (Apr. 2001), F63-F66.

Zhu, W, et al., "HfO$_2$ and HfAlO for CMOS: Thermal Stability and Current Transport", *IEEE International Electron Device Meeting 2001*, (2001), 463-466.

Zucker, O, et al., "Application of Oxygen Plasma Processing to Silicon Direct Bonding", *Sensors and Actuators A*, 36, (1993), 227-231.

Gusev, E. P., et al., "High-resolution depth profiling in ultrathin Al$_2$O$_3$ films on Si", Applied Physics Letters, 76(2), (Jan. 10, 2000), 176-178.

Kim, Yong S, et al., "Effect of rapid thermal annealing on the structure and the electrical properties of atomic-layer-deposited Ta$_2$O$_5$ films", Journal of the Korean Physical Society, (Dec. 2000), 975-979.

Rahtu, Antti, "Atomic Layer Deposition of Zirconium Titanium Oxide from Titanium Isopropoxide and Zirconium Chloride", Chemistry of Materials, 13(5), (May 2001), 1528-1532.

\* cited by examiner

ZR-SN-TI-O FILMS

RELATED APPLICATIONS

This application is a divisional application of U.S. application Ser. No. 11/084,968 filed on Mar. 21, 2005, now U.S. Pat. No. 7,611,959, which is a continuation of U.S. application Ser. No. 10/309,935 filed Dec. 4, 2002, now U.S. Pat. No. 7,101,813, which applications are incorporated herein by reference in their entirety.

This application is related to the following, co-pending, commonly assigned applications, incorporated herein by reference:

U.S. application Ser. No. 10/137,058, U.S. Pat. No. 7,589, 029, entitled: "Atomic Layer Deposition and Conversion,"

U.S. application Ser. No. 10/137,168, U.S. Pat. No. 7,160, 577, entitled: "Methods for Atomic-Layer Deposition of Aluminum Oxides in Integrated Circuits,"

U.S. application Ser. No. 09/797,324, U.S. Pat. No. 6,852, 167, entitled: "Methods, Systems, and Apparatus for Uniform Chemical-Vapor Depositions," and U.S. application Ser. No. 10/309,583, U.S. Pat. No. 6,958, 302, entitled: "Atomic Layer Deposited Zr—Sn—Ti—O Films Using $TiI_4$."

FIELD OF THE INVENTION

The invention relates to semiconductor devices and device fabrication. Specifically, the invention relates to dielectric layers and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, and memory devices such as dynamic random access memories (DRAMs). The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. A transistor 100 is fabricated in a substrate 110 that is typically silicon, but could be fabricated from other semiconductor materials as well. Transistor 100 has a source region 120 and a drain region 130. A body region 132 is located between source region 120 and drain region 130, where body region 132 defines a channel of the transistor with a channel length 134. A gate dielectric 140 is located on body region 132 with a gate 150 located over gate dielectric 140. Although gate dielectric 140 may be formed from materials other than oxides, gate dielectric 140 is typically an oxide, and is commonly referred to as a gate oxide. Gate 150 may be fabricated from polycrystalline silicon (polysilicon), or other conducting materials such as metal may be used.

In fabricating transistors to be smaller in size and reliably operate on lower power supplies, one important design criteria is gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but increased scaling and other requirements for gate dielectrics create the need to find other dielectric materials to be used for a gate dielectric.

DETAILED DESCRIPTION OF THE PREFERRED EMBODIMENTS

In the following detailed description of the invention, reference is made to the accompanying drawings that form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
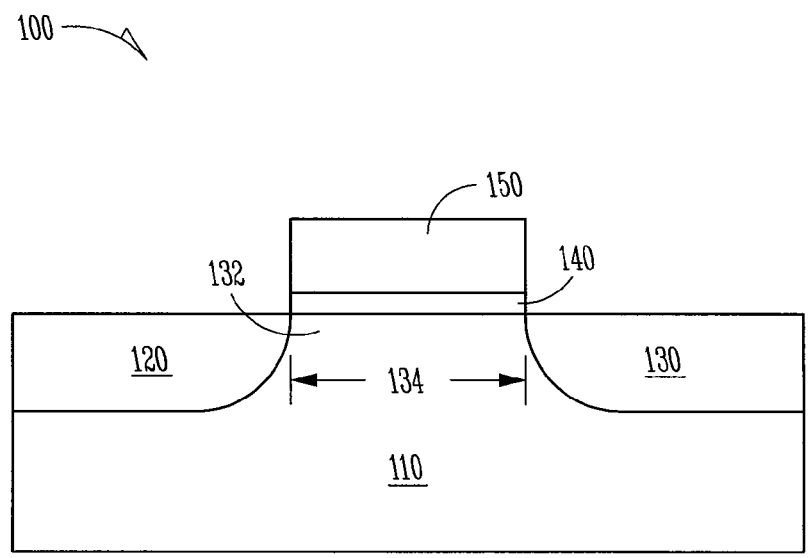
FIG. 1 shows a common configuration of a transistor in which an embodiment of a gate dielectric containing atomic layer deposited Zr—Sn—Ti—O may be formed according to the teachings of the present invention.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region may result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric could cause an effective short between an underlying Si channel and an overlying polysilicon gate. This undesirable property sets a limit on the physical thickness to which a $SiO_2$ layer may be scaled. The minimum thickness due to this monolayer effect is thought to be about 7-8 Å. Therefore, for future devices to have a $t_{eq}$ less than about 10 Å, dielectrics other than $SiO_2$ need to be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox} = 3.9$, as $$t = (\kappa/\kappa_{ox})t_{eq} = (\kappa/3.9)t_{eq}.$$

Thus, materials with a dielectric constant greater than that of $SiO_2$, 3.9, will have a physical thickness that may be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors may be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq} = t_{SiO2} + (\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

In a recent article by G. D. Wilk et al., *Journal of Applied Physics*, vol. 89, no. 10, pp. 5243-5275 (2001), material properties of high dielectric materials for gate dielectrics were discussed. Among the information disclosed was the viability of $Al_2O_3$ as a substitute for $SiO_2$. $Al_2O_3$ was disclosed has having favourable properties for use as a gate dielectric such as high band gap, thermodynamic stability on Si up to high temperatures, and an amorphous structure. In addition, Wilk disclosed that forming a layer of $Al_2O_3$ on silicon does not result in a $SiO_2$ interfacial layer. However, the dielectric constant of $Al_2O_3$ is only 9, where thin layers may have a dielectric constant of about 8 to about 10. Though the dielectric constant of $Al_2O_3$ is in an improvement over $SiO_2$, a higher dielectric constant for a gate dielectric is desirable. Other dielectrics and their properties discussed by Wilk include

| Material | Dielectric Constant (κ) | Band gap $E_g$ (eV) | Crystal Structure(s) |
|---|---|---|---|
| $SiO_2$ | 3.9 | 8.9 | Amorphous |
| $Si_3N_4$ | 7 | 5.1 | Amorphous |
| $Al_2O_3$ | 9 | 8.7 | Amorphous |
| $Y_2O_3$ | 15 | 5.6 | Cubic |
| $La_2O_3$ | 30 | 4.3 | Hexagonal, Cubic |
| $Ta_2O_5$ | 26 | 4.5 | Orthorhombic |
| $TiO_2$ | 80 | 3.5 | Tetrag. (rutile, anatase) |
| $HfO_2$ | 25 | 5.7 | Mono., Tetrag., Cubic |
| $ZrO_2$ | 25 | 7.8 | Mono., Tetrag., Cubic |

One of the advantages using $SiO_2$ as a gate dielectric has been that the formation of the $SiO_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric may cause variations in the film's dielectric constant. The abovementioned material properties including crystal structure are for the materials in a bulk form. The materials having the advantage of a high dielectric constant relative to $SiO_2$ also have the disadvantage of a crystalline form, at least in a bulk configuration. Thus, the best candidates for replacing $SiO_2$ as a gate dielectric are those with high dielectric constant, which may be fabricated as a thin layer with an amorphous form.

Based solely on the size of the dielectric constant, titanium oxide, $TiO_2$, appears to be an excellent candidate for replacing $SiO_2$. However, $TiO_2$ does not provide the electrical properties generally desired for integrated circuits, such as, high electric field breakdown and low leakage current. Other possible replacements for amorphous $SiO_2$ include layers of $TaO_x$, $Ta_2O_5$, $TiO_x$, and $(Ba, Sr)TiO_3$. Each of these replacements has advantages and disadvantages. Additional candidates for replacing amorphous $SiO_2$ include sputter deposited amorphous Ti-rich Zr—Sn—Ti—O, pulsed laser deposited $Zr_{1-x}Sn_xTiO_4$, sputter deposited crystalline films of $Zr_yTi_{1-y}O_4$ and $Zr_ySn_xTi_{1-x-y}O_4$ with $0.3<y<0.7$ and $0<x<0.2$, and reactive sputtered $Zr_{0.2}Sn_{0.2}Ti_{0.6}O_2$. The pulsed laser deposited $Zr_{1-x}Sn_xTiO_4$ thin films were found to have a dielectric constant of about 36. Additionally, the sputtered deposited crystalline films of $Zr_yTi_{1-y}O_4$ and $Zr_ySn_xTi_{1-x-y}O_4$ with $0.3<y<0.7$ and $0<x<0.2$ were found to have dielectric constant of about 33 for 450 Å thick films, while reactive sputtered amorphous $Zr_{0.2}Sn_{0.2}Ti_{0.6}O_2$ thin films were found to have a dielectric constant ranging from about 50 to about 70. See, O. Nakagawara et al., *Journal of Applied Physics*, vol. 80, no. 1, pp. 388-392 (1998), E. S. Ramakrishnan et al., *Journal of Electrochemical Society*, vol. 145, no. 1, pp. 358-362 (1998), and R. B. Dover et al., *IEEE Electron Device Letters*, vol. 19, no. 9, pp. 329-331 (1998).

In an embodiment, a method of forming a dielectric film may include the formation of Zr—Sn—Ti—O by depositing materials of the Zr—Sn—Ti—O film substantially as atomic monolayers. In an embodiment, a method includes depositing titanium and oxygen onto a substrate surface substantially as an atomic monolayer, depositing zirconium and oxygen onto the substrate surface substantially as an atomic monolayer, and depositing tin and oxygen onto the substrate surface substantially as an atomic monolayer to form a Zr—Sn—Ti—O dielectric layer. The Zr—Sn—Ti—O layer thickness may be controlled by processing a total number of substantially atomic monolayers to produce the desired thickness.

A dielectric film containing Zr—Sn—Ti—O has a larger dielectric constant than silicon dioxide, a relatively small leakage current, and good stability with respect to a silicon based substrate. Embodiments include methods for forming capacitors, transistors, memory devices, and electronic systems having dielectric layers containing a Zr—Sn—Ti—O film such that Zr—Sn—Ti—O material is configured as substantially atomic monolayers.

Other embodiments include structures for capacitors, transistors, memory devices, and electronic systems with dielectric layers containing a Zr—Sn—Ti—O film such that Zr—Sn—Ti—O material is configured as substantially atomic monolayers. Such dielectric films provide a significantly thinner equivalent oxide thickness compared with a silicon oxide layer having the same physical thickness. Alternatively, such dielectric films provide a significantly thicker physical thickness than a silicon oxide layer having the same equivalent oxide thickness.

However, other considerations for selecting the material and method for forming a dielectric film for use in electronic devices and systems concern the suitability of the material for applications requiring that the dielectric film have a ultra-thin equivalent oxide thickness, form conformally on a substrate, and/or be engineered to specific thickness and elemental concentrations. Another consideration concerns the roughness of the dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer may have a rough contour due to the rough interface at the body region.

In an embodiment according to the teachings of the present invention, a Zr—Sn—Ti—O dielectric film having a substantially smooth surface relative to other processing techniques may be formed using atomic layer deposition (ALD). Further, forming a dielectric film using atomic layer deposition may provide for controlling transitions between material layers. Thus, atomic layer deposited Zr—Sn—Ti—O dielectric films may have an engineered transition with a substrate surface that has a substantially reduced or no interfacial $SiO_2$ layer. Further, the ALD deposited Zr—Sn—Ti—O dielectric films may provide conformal coverage on the surfaces on which they are deposited.

ALD, also known as atomic layer epitaxy (ALE), was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle may be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors may be used though evaporation rates may somewhat vary during the process because of changes in their surface area.

There are several other requirements for precursors used in ALD. The precursors must be thermally stable at the substrate temperature because their decomposition would destroy the surface control and accordingly the advantages of the ALD method that relies on the reaction of the precursor at the substrate surface. A slight decomposition, if slow compared to the ALD growth, may be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

The advantages of RS-ALD include continuity at an interface, conformality over a substrate, use of low temperature and mildly oxidizing processes, freedom from first wafer effects and chamber dependence, growth thickness dependent solely on the number of cycles performed, and ability to engineer multilayer laminate films with resolution of one to two monolayers. RS-ALD allows for deposition control on the order on monolayers and the ability to deposit monolayers of amorphous films.

Herein, a sequence refers to the ALD material formation based on an ALD reaction of one precursor with its reactant precursor. For example, forming titanium oxide from a $TiCl_4$ precursor and $H_2O_2$, as its reactant precursor, forms an embodiment of a titanium/oxygen sequence, which may also be referred to as titanium sequence. A cycle of a sequence may include pulsing a precursor, pulsing a purging gas for the precursor, pulsing a reactant precursor, and pulsing the reactant's purging gas. Alternately, an ALD cycle for forming a particular material may consist of several cycles, each of the several cycles associated with a different sequence. In an embodiment, a Zr—Sn—Ti—O cycle may include a titanium/oxygen sequence, a zirconium/oxygen sequence, and a tin/oxygen sequence.

In an embodiment, a layer of Zr—Sn—Ti—O is formed on a substrate mounted in a reaction chamber using ALD in a repetitive sequence using precursor gases individually pulsed into the reaction chamber. Alternately, solid or liquid precursors may be used in an appropriately designed reaction chamber. ALD formation of other materials is disclosed in co-pending, commonly assigned U.S. patent application: entitled "Atomic Layer Deposition and Conversion," Ser. No. 10/137,058, and "Methods, Systems, and Apparatus for Atomic-Layer Deposition of Aluminum Oxides in Integrated Circuits," Ser. No. 10/137,168, U.S. Pat. No. 7,160,577.

Figure 2A:
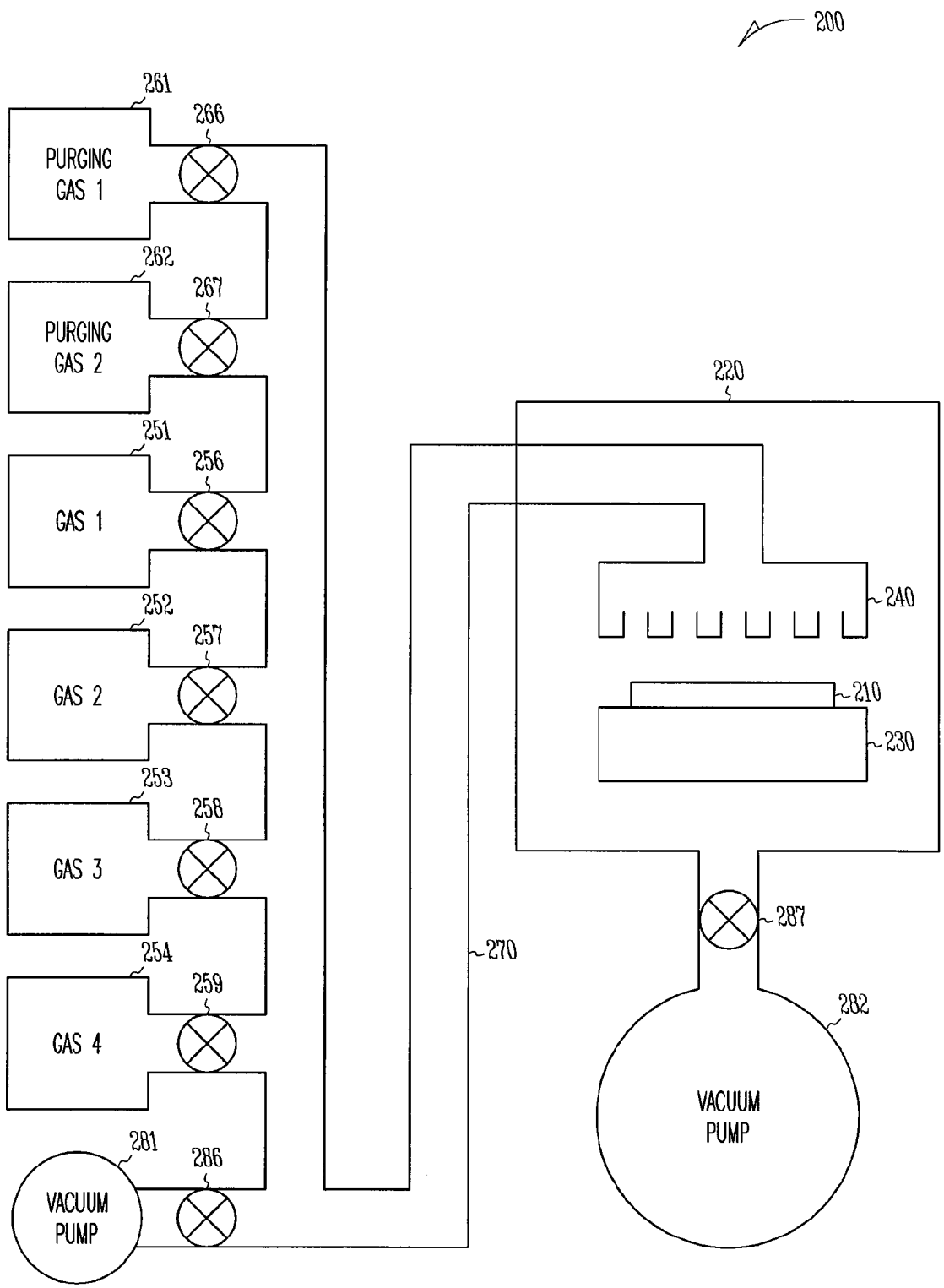
FIG. 2A shows an embodiment of an atomic layer deposition system for processing a dielectric film containing Zr—Sn—Ti—O, according to the teachings of the present invention.

FIG. 2A shows an embodiment of an atomic layer deposition system 200 for processing a dielectric film containing Zr—Sn—Ti—O. The elements depicted are those elements necessary for discussion of the present invention such that those skilled in the art may practice the present invention without undue experimentation. A further discussion of the ALD reaction chamber can be found in co-pending, commonly assigned U.S. patent application: entitled "Methods, Systems, and Apparatus for Uniform Chemical-Vapor Depositions," Ser. No. 09/797,324, U.S. Pat. No. 6,852,167, incorporated herein by reference.

In FIG. 2A, a substrate 210 is located inside a reaction chamber 220 of ALD system 200. Also located within reaction chamber 220 is a heating element 230, which is thermally coupled to substrate 210 to control the substrate temperature. A gas-distribution fixture 240 introduces precursor gases to the substrate 210. Each precursor gas originates from individual gas sources 251-254 whose flow is controlled by mass-flow controllers 256-259, respectively. Gas sources 251-254 provide a precursor gas either by storing the precursor as a gas or by providing a location and apparatus for evaporating a solid or liquid material to form the selected precursor gas. Furthermore, additional gas sources may be included, one for each metal precursor employed and one for each reactant precursor associated with each metal precursor.

Also included in the ALD system are purging gas sources 261, 262, each of which is coupled to mass-flow controllers 266, 267, respectively. Furthermore, additional purging gas sources may be constructed in ALD system 200, one purging gas source for each precursor gas. For a process that uses the same purging gas for multiple precursor gases less purging gas sources are required for ALD system 200. Gas sources 251-254 and purging gas sources 261-262 are coupled by their associated mass-flow controllers to a common gas line or conduit 270, which is coupled to the gas-distribution fixture 240 inside reaction chamber 220. Gas conduit 270 is also coupled to vacuum pump, or exhaust pump, 281 by mass-flow controller 286 to remove excess precursor gases, purging gases, and by-product gases at the end of a purging sequence from the gas conduit.

Vacuum pump, or exhaust pump, 282 is coupled by mass-flow controller 287 to remove excess precursor gases, purging gases, and by-product gases at the end of a purging sequence from reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
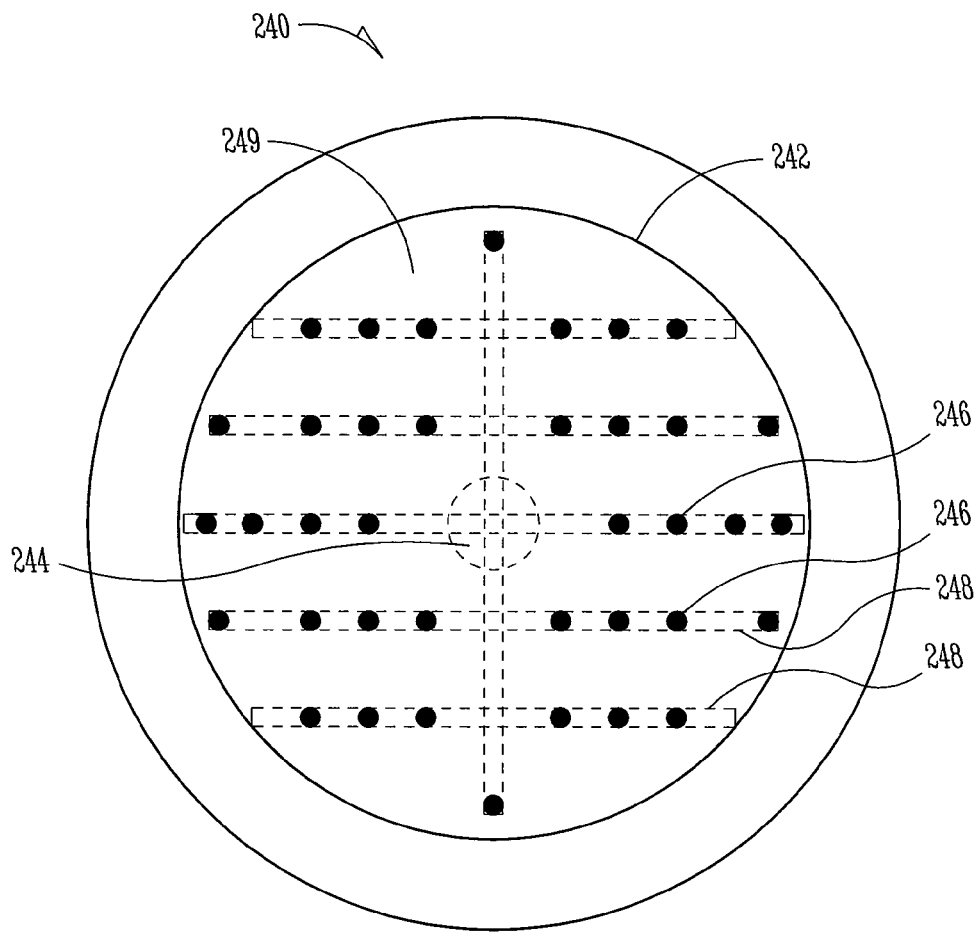
FIG. 2B shows an embodiment of a gas-distribution fixture of an atomic layer deposition system for processing a dielectric film containing Zr—Sn—Ti—O, according to the teachings of the present invention.

FIG. 2B shows an embodiment of a gas-distribution fixture 240 of atomic layer deposition system 200 for processing a dielectric film containing Zr—Sn—Ti—O. Gas-distribution fixture 240 includes a gas-distribution member 242, and a gas inlet 244. Gas inlet 244 couples gas-distribution member 242 to gas conduit 270 of FIG. 2A. Gas-distribution member 242 includes gas-distribution holes, or orifices, 246 and gas-distribution channels 248. In the exemplary embodiment, holes 246 are substantially circular with a common diameter in the range of 15-20 microns, gas-distribution channels 248 have a common width in the range of 20-45 microns. The surface 249 of gas distribution member 242 having gas-distribution holes 246 is substantially planar and parallel to substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though ALD system 200 is well suited for practicing the present invention, other ALD systems commercially available may be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 200 may be controlled by a computer. To focus on the use of ALD system 200 in the various embodiments of the present invention, the computer is not shown. Those skilled in the art can appreciate that the individual elements such as pressure control, temperature control, and gas flow within ALD system 200 may be under computer control. In an embodiment, a computer to accurately control the integrated functioning of the elements of ALD system 200 to form a dielectric film containing Zr—Sn—Ti—O executes instructions stored in a computer readable medium.

In an embodiment, a method of forming a dielectric film may include forming a Zr—Sn—Ti—O film on a substrate surface by atomic layer deposition. In another embodiment, the method may further include controlling the atomic layer deposition to form the dielectric film as an amorphous Ti-rich Zr—Sn—Ti—O film. A Ti-rich Zr—Sn—Ti—O film is a Zr—Sn—Ti—O film in which Ti is present as 50% or more of the total metal atoms in the Zr—Sn—Ti—O. In another embodiment, the method may further include controlling the atomic layer deposition to form the dielectric film having a composition substantially of $Zr_ySn_xTi_{1-x-y}O_4$ with $0.3<y<0.7$ and $0<x<0.2$. Alternately, the method may further include controlling the atomic layer deposition to form the dielectric film having a composition substantially of $Zr_{0.2}Sn_{0.2}Ti_{0.6}O_2$. In an embodiment, each of a titanium sequence, a zirconium sequence, and a tin sequence may include using precursors that form would metal oxides for each metal sequence.

Figure 3:
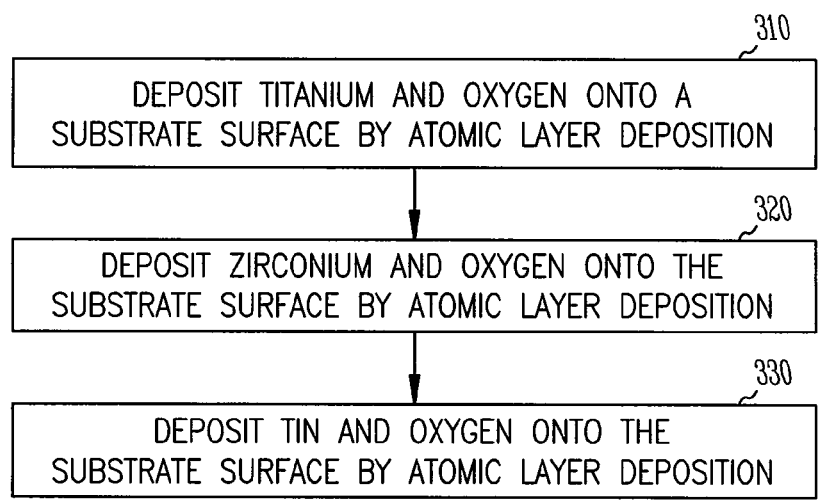
FIG. 3 illustrates a flow diagram of elements for an embodiment of a method to process a dielectric film containing Zr—Sn—Ti—O by atomic layer deposition, according to the teachings of the present invention.

FIG. 3 illustrates a flow diagram of elements for an embodiment of a method to process a dielectric film containing Zr—Sn—Ti—O by atomic layer deposition. This embodiment for forming a Zr—Sn—Ti—O dielectric film by atomic layer deposition may include depositing titanium and oxygen onto a substrate surface by atomic layer deposition, at block 310, depositing zirconium and oxygen onto the substrate surface by atomic layer deposition, at block 320, and depositing tin and oxygen onto the substrate surface by atomic layer deposition, at block 330. In an embodiment, performing a titanium sequence, a zirconium sequence, and a tin sequence constitutes one cycle. As multiple cycles are performed, the substrate surface becomes the original substrate surface with a layer of Zr—Sn—Ti—O formed on it. The thickness of the Zr—Sn—Ti—O varies with the number of cycles performed. Within a given cycle, the substrate surface is the substrate surface of the previous cycle with additional material formed corresponding to the completed sequences within the given cycle.

In an embodiment, depositing titanium and oxygen onto a substrate surface may include forming $TiO_2$ onto the substrate surface by atomic layer deposition. Subsequent ALD processing of a zirconium sequence and a tin sequence forms a dielectric film containing Zr—Sn—Ti—O. In an embodiment, forming a dielectric film containing Zr—Sn—Ti—O by atomic layer deposition may include pulsing a $TiCl_4$ precursor, pulsing a $ZrCl_4$ precursor, pulsing a $SnCl_4$ precursor, and pulsing a water vapor precursor. Each pulsing delivers the associated precursor onto the substrate surface, where the substrate surface includes the previous precursor chemisorbed or reacted.

Performing each atomic layer deposition includes pulsing a plurality of precursors into a reaction chamber for a predetermined period. The predetermined period is individually controlled for each precursor pulsed into the reaction chamber. Further the substrate is maintained at a selected temperature for each pulsing of a precursor, where the selected temperature is set independently for pulsing each precursor. Additionally, each precursor may be pulsed into the reaction under separate environmental conditions. Appropriate temperatures and pressures are maintained dependent on the nature of the precursor, whether the precursor is a single precursor or a mixture of precursors.

Using atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a layer of Zr—Sn—Ti—O. Additionally, the reaction chamber may also be purged by evacuating the reaction chamber.

Figure 4:
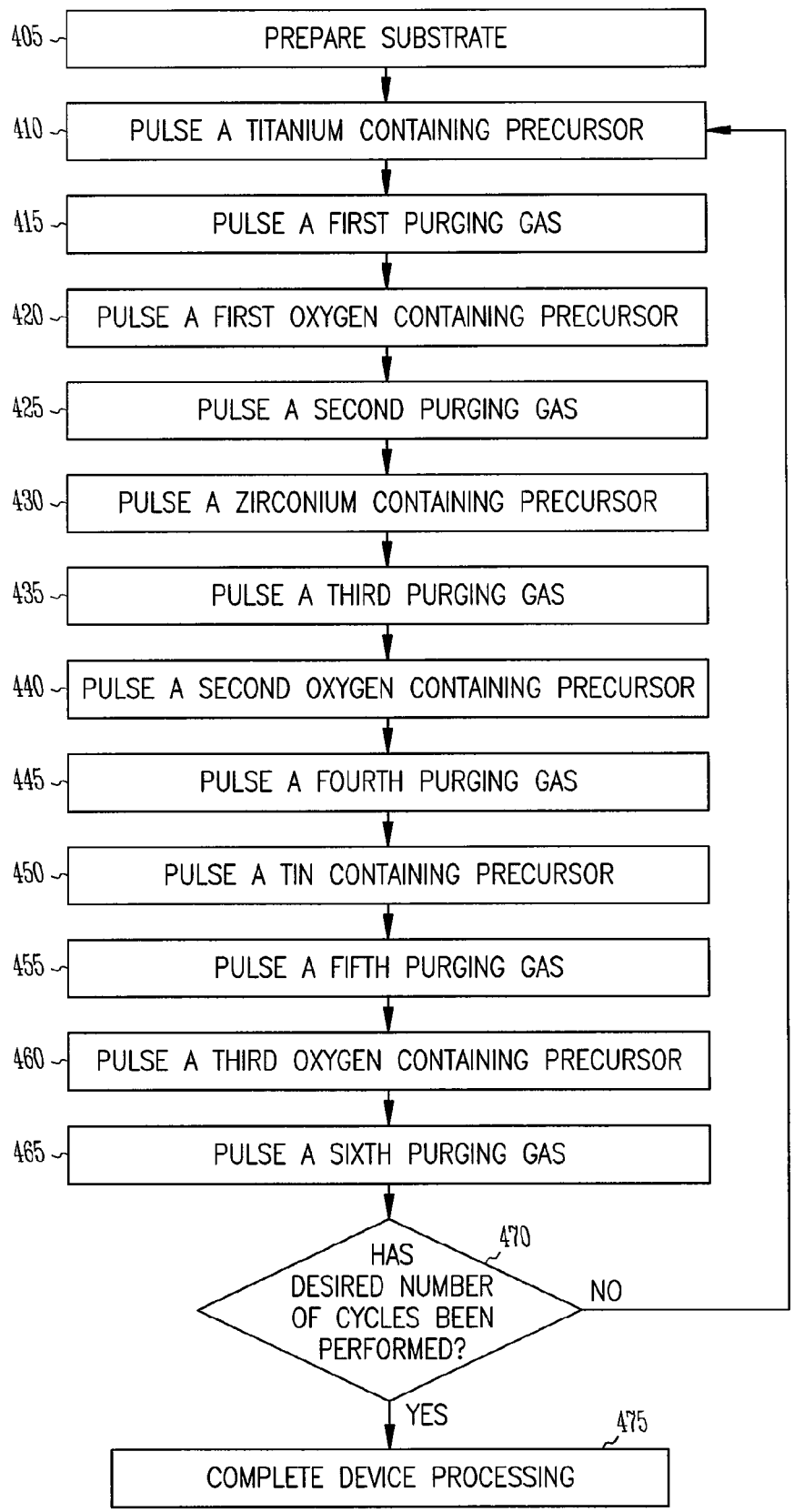
FIG. 4 illustrates a flow diagram of elements for another embodiment of a method to process a dielectric film containing Zr—Sn—Ti—O by atomic layer deposition, according to the teachings of the present invention.

FIG. 4 illustrates a flow diagram of elements for another embodiment of a method to process a dielectric film containing Zr—Sn—Ti—O by atomic layer deposition. This embodiment may be implemented with the atomic layer deposition system 200 of FIG. 2A,B.

At block 405, substrate 210 is prepared. The substrate used for forming a transistor is typically a silicon or silicon containing material. In other embodiments, germanium, gallium arsenide, silicon-on-sapphire substrates, or other suitable substrates may be used. This preparation process may include cleaning of substrate 210 and forming layers and regions of the substrate, such as drains and sources of a metal oxide semiconductor (MOS) transistor, prior to forming a gate dielectric. The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region may include a body region of a transistor, however one skilled in the art will recognize that other semiconductor device structures may utilize this process. Additionally, substrate 210 in its ready for processing form is conveyed into a position in reaction chamber 220 for ALD processing.

At block 410, a titanium containing precursor is pulsed into reaction chamber 220. In an embodiment, $TiCl_4$ is used as a precursor. The $TiCl_4$ precursor is pulsed into reaction chamber 220 through the gas-distribution fixture 240 onto substrate 210. Mass-flow controller 256 regulates the flow of the $TiCl_4$ from gas source 251, where the $TiCl_4$ is about 99.9% pure with an evaporation temperature of about 8° C. In an embodiment, the substrate temperature is maintained between about 120° C. and about 365° C. The $TiCl_4$ reacts with the surface of the substrate 210 in the desired region defined by the unmasked areas of the substrate 210. In other embodiments, a titanium containing precursor is selected from a group consisting of $Ti(OC_2H_5)_4$, and $Ti(OC_3H_7)_4$.

At block 415, a first purging gas is pulsed into reaction chamber 220. In particular, nitrogen with a purity of about 99.999% is used as a purging gas and a carrier gas at a flow rate of about 80 sccm and a pressure of about 10 mbar. Mass-flow controller 266 regulates the nitrogen flow from the purging gas source 261 into the gas conduit 270. Using the pure nitrogen purge avoids overlap of the precursor pulses and possible gas phase reactions. Following the purge, a first oxygen containing precursor is pulsed into reaction chamber 220, at block 420.

For the titanium sequence using $TiCl_4$ as the precursor, water vapor is selected as the precursor acting as a reactant to form Ti and O on the substrate 210. Alternately, $H_2O_2$ may be used as the oxygen containing precursor. Mass-flow controller 257 regulates the water vapor pulsing into reaction chamber 220 through gas conduit 270 from gas source 252 where the water vapor is held at about 10° C. The water vapor aggressively reacts at the surface of substrate 210.

Following the pulsing of an oxygen containing precursor, a second purging gas is injected into reaction chamber 220, at block 425. Nitrogen gas is used to purge the reaction chamber after pulsing each precursor gas in the titanium/oxygen sequence. Excess precursor gas, and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286.

During a $TiCl_4$/water vapor sequence, the substrate is held between about 120° C. and about 365° C. by the heating element 230. The $TiCl_4$ pulse time may range from about 0.2 sec to about 2 sec. After the $TiCl_4$ pulse, the titanium sequence continues with a purge pulse followed by a water vapor pulse followed by a purge pulse. In an embodiment, the water vapor pulse time may range from about 0.2 sec to about 2 sec, and the first and second purging pulse times are each at about 5 secs and 10 secs, respectively. In an embodiment, the titanium/oxygen sequence may include a 0.2 sec $TiCl_4$ pulse, a 5 sec nitrogen pulse, a 0.2 sec water vapor pulse, and a 10 sec nitrogen pulse.

At block 430, a zirconium containing precursor is pulsed into reaction chamber 220. In an embodiment, $ZrCl_4$ is used as the zirconium containing precursor. The $ZrCl_4$ precursor having a purity of about 99.9% is evaporated from a containment area held at about 165° C. in gas source 253. Mass-flow controller 258 regulates the pulsing of the $ZrCl_4$ precursor to the surface of the substrate 210 through gas-distribution fixture 240 from gas source 253. In an embodiment, the substrate temperature is maintained between about 300° C. and about 500° C.

At block 435, a third purging gas is introduced into the system. Nitrogen gas may also be used as a purging and carrier gas. The nitrogen flow is controlled by mass-flow controller 267 from the purging gas source 262 into the gas conduit 270 and subsequently into reaction chamber 220. In another embodiment, argon gas may be used as the purging gas. Following the pulsing of the third purging gas, a second oxygen containing precursor is pulsed into reaction chamber 220, at block 440. In an embodiment the second oxygen containing precursor is water vapor. Mass-flow controller 257 regulates the water vapor pulsing into reaction chamber 220 through gas conduit 270 from gas source 252. The water vapor aggressively reacts at the surface of substrate 210.

Following the pulsing of the second oxygen containing precursor, a fourth purging gas is injected into reaction chamber 220, at block 445. Nitrogen gas may be used to purge the reaction chamber after pulsing each precursor gas in the zirconium/oxygen sequence. In another embodiment, argon gas may be used as the purging gas. Excess precursor gas, and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286.

At block 450, a tin containing precursor is pulsed into reaction chamber 220. In an embodiment, $SnCl_4$ is used as the tin containing precursor. The $SnCl_4$ precursor having a purity of about 99.9% is pulsed from gas source 254 that is held at about 8° C. Alternately, the $SnCl_4$ is held in gas source 254 at a temperature ranging from about −1° C. to about 22° C. Mass-flow controller 259 regulates the pulsing of the $SnCl_4$ precursor to the surface of substrate 210 through gas-distribution fixture 240 from gas source 254. In an embodiment, the substrate temperature is maintained between about 430° C. and about 545° C.

At block 455, a fifth purging gas is introduced into the system. Pure nitrogen gas may also be used as a purging and carrier gas. The nitrogen flow is controlled by mass-flow controller 267 from the purging gas source 262 into the gas conduit 270 and subsequently into reaction chamber 220.

Following the pulsing of the fifth purging gas, a third oxygen containing precursor is pulsed into reaction chamber 220, at block 460. In an embodiment, the third oxygen containing precursor is water vapor. The water vapor is raised to about 24° C. in gas source 252. Mass-flow controller 257 regulates the water vapor pulsing into reaction chamber 220 through gas conduit 270 from gas source 252. The water vapor aggressively reacts at the surface of substrate 210.

Following the pulsing of the third oxygen containing precursor, a sixth purging gas is injected into reaction chamber 220, at block 465. Pure nitrogen gas may be used to purge the reaction chamber after pulsing each precursor gas in the tin/oxygen sequence. In another embodiment, argon gas may be used as the purging gas. Excess precursor gas, and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286.

During a $SnCl_4$/water vapor sequence, the substrate is held between about 430° C. and about 545° C. by the heating element 230. Alternately, the substrate is held at a temperature in the range of about 300° C. to about 600° C. at a pressure of about 2 mbar. The $SnCl_4$ pulse time ranges from about 0.2 sec to about 10 sec. After the $SnCl_4$ pulse, the tin sequence continues with a purge pulse followed by a water vapor pulse followed by a purge pulse. In an embodiment, the water vapor pulse time may range from about 0.6 secs to about 30 secs, and the SnCl4 and the water vapor purging pulse times are each between about 3 secs and 90 secs.

At block 470, a determination is made as to whether a desired number of cycles has been performed, that is, whether the number of completed cycles is equal to a predetermined number. The predetermined number corresponds to a predetermined thickness for the ALD Zr—Sn—Ti—O dielectric film. If the number of completed cycles is less than the predetermined number, the titanium containing precursor is pulsed into reaction chamber 220, at block 410, and the process continues. If the total number of cycles to form the desired thickness has been completed, the dielectric film containing Zr—Sn—Ti—O may be annealed. To avoid the diffusion of oxygen to the semiconductor substrate surface, any annealing may be performed in an oxygen-free environment for short periods of time. An embodiment of an annealing environment may include a nitrogen atmosphere. In addition to avoiding oxygen diffusion to the semiconductor substrate, the relatively low temperatures employed by atomic layer deposition of a Zr—Sn—Ti—O dielectric layer allows for the formation of an amorphous Zr—Sn—Ti—O dielectric layer.

The thickness of a Zr—Sn—Ti—O film is determined by a fixed growth rate for the pulsing periods and precursors used, set at a value such as N nm/cycle. For a desired Zr—Sn—Ti—O film thickness, t, in an application such as forming a gate dielectric of a MOS transistor, the ALD process is repeated for t/N total cycles. Once the t/N cycles have completed, no further ALD processing for Zr—Sn—Ti—O is required.

At block 475, after forming the Zr—Sn—Ti—O, processing the device having the dielectric layer containing Zr—Sn—Ti—O is completed. In an embodiment, completing the device may include completing the formation of a transistor. In another embodiment, completing the device may include completing the formation of a capacitor. Alternately, completing the process may include completing the construction of a memory device having a array with access transistors formed with gate dielectrics containing atomic layer deposited Zr—Sn—Ti—O. Further, in another embodiment, completing the process may include the formation of an electronic system including an information handling device that uses electronic devices with transistors formed with dielectric films containing atomic layer deposited Zr—Sn—Ti—O. Typically, information handling devices such as computers include many memory devices, having many access transistors.

It can be appreciated by those skilled in the art that the elements of a method for forming an atomic layer deposited Zr—Sn—Ti—O film in the embodiment of FIG. 4 may be performed under various other environmental conditions and pulse periods depending on the Zr—Sn—Ti—O film to be formed for a given application and the system used to fabricate the Zr—Sn—Ti—O film. Determination of the environmental conditions, precursors used, purging gases employed, and pulse periods for the precursors and purging gases may be made without undue experimentation.

Further, it can also be appreciated by those skilled in the art that the elements of a method for forming an atomic layer deposited Zr—Sn—Ti—O film in the embodiment of FIG. 4 may be performed with various permutations of the three sequences used to form the Zr—Sn—Ti—O dielectric film. In an embodiment, the zirconium/oxygen sequence is performed first. In another embodiment, the tin/oxygen sequence is performed first. Further, for a given cycle, any one sequence may be performed multiple times with respect to the other sequences. For example, a Zr—Sn—Ti—O cycle may include three titanium/oxygen sequences, one zirconium/oxygen sequence, and one tin/oxygen sequence. In an embodiment, a number of cycles for a titanium/oxygen sequence is performed along with a number of cycles for a zirconium/oxygen sequence and a number of cycles for a tin/oxygen sequence such that a Zr—Sn—Ti—O layer is formed having a composition as a solid solution of $TiO_2$—$ZrO_2$—$SnO_2$. Alternately, a solid solution of $TiO_x$—$ZrO_x$—$SnO_x$ is formed as a dielectric film. Thus, ALD processing of a Zr—Sn—Ti—O layer provides for engineering of the composition of the Zr—Sn—Ti—O dielectric film.

In an embodiment, ALD processing of a Zr—Sn—Ti—O dielectric layer may include pulsing metal halides as precursors for each metal in the Zr—Sn—Ti—O layer. Additionally, water vapor may be used as the oxygen containing precursor for each sequence in an ALD cycle for forming a Zr—Sn—Ti—O layer. Other oxygen containing precursors may include $H_2O_2$ or a $H_2O$—$H_2O_2$ mixture. Alternately, other metal containing precursors and oxygen containing precursors may be used in the ALD formation of a Zr—Sn—Ti—O layer. These alternate metal containing precursors should chemisorb or react with the substrate surface without causing the resulting layer to form $SiO_2$ upon reaction with the oxygen containing precursors.

In an embodiment, ALD processing provides a method for controlling the formation of the dielectric film such that the dielectric film is an amorphous Ti-rich Zr—Sn—Ti—O film. In another embodiment, ALD processing may include controlling the atomic layer deposition to form the Zr—Sn—Ti—O dielectric film having a composition substantially of $Zr_ySn_xTi_{1-x-y}O_4$ with $0.3<y<0.7$ and $0<x<0.2$. Alternately, ALD processing may include controlling the atomic layer deposition to form the Zr—Sn—Ti—O dielectric film having a composition substantially of $Zr_{0.2}Sn_{0.2}Ti_{0.6}O_2$.

In an embodiment, ALD processing provides for the engineering of a dielectric film containing Zr—Sn—Ti—O having a dielectric constant in the range from about 33 to about 70, or alternately from about 50 to about 70. In another embodiment, ALD processing provides for the engineering of a dielectric film containing Zr—Sn—Ti—O having a dielectric constant in the range from about 33 to about 37.

Atomic layer deposition of a Zr—Sn—Ti—O dielectric layer may be processed in an atomic layer deposition system such as ALD system 200 under computer control to perform various embodiments, in accordance with the teachings of the current invention, and operated under computer-executable instructions to perform these embodiments. In an embodiment, a computerized method and the computer-executable instructions for a method for forming a dielectric film may include forming a Zr—Sn—Ti—O dielectric film by atomic layer deposition. In another embodiment, a computerized method and the computer-executable instructions for a method for forming a dielectric film may include depositing titanium and oxygen onto a substrate surface by atomic layer deposition, depositing zirconium and oxygen onto the substrate surface by atomic layer deposition, and depositing tin and oxygen onto the substrate surface by atomic layer deposition.

In an embodiment, a computerized method and the computer-executable instructions for a method for forming a dielectric film may further include forming the Zr—Sn—Ti—O dielectric film by atomic layer deposition, where a plurality of precursors are pulsed into a reaction chamber for a predetermined period. The predetermined period is individually controlled for each precursor pulsed into the reaction chamber. Further, the substrate may be maintained at a selected temperature for each pulsing of a precursor, where the selected temperature is set independently for pulsing each precursor. In addition, each pulsing of a precursor is followed by purging the reaction chamber with a purging gas.

In an embodiment, a computerized method and the computer-executable instructions for a method for forming a dielectric film may further include regulating the deposition of zirconium, tin, titanium, and oxygen to form a dielectric film having a dielectric constant in the range from about 33 to about 70, or alternately from about 50 to about 70. Further, the computerized method and the computer-executable instructions may include regulating the deposition of zirconium, tin, titanium, and oxygen to form a dielectric film having a dielectric constant in the range from about 33 to about 37.

In another embodiment, a computerized method and the computer-executable instructions for a method for forming a dielectric film may include forming $TiO_2$ onto a substrate surface by atomic layer deposition, depositing zirconium and oxygen onto the substrate surface by atomic layer deposition, and depositing tin and oxygen onto the substrate surface by atomic layer deposition. Further, depositing $TiO_2$ onto a substrate surface by atomic layer deposition may include pulsing a $TiCl_4$ precursor.

In another embodiment, a computerized method and the computer-executable instructions for a method for forming a dielectric film may further include controlling an environment of a reaction chamber. Additionally, the computerized method controls the pulsing of purging gases, one for each precursor gas and pulsing each purging gas after pulsing the associated precursor gas. Using a computer to control parameters for growing the dielectric film provides for processing the dielectric film over a wide range of parameters allowing for the determination of an optimum parameter set for the ALD system used. The computer-executable instructions may be provided in any computer-readable medium. Such computer-readable medium may include, but is not limited to, floppy disks, diskettes, hard disks, CD-ROMS, flash ROMS, nonvolatile ROM, and RAM.

An embodiment of this method may be realized using ALD system 200 of FIG. 2A, where the controls for the individual elements of ALD system 200 are coupled to a computer, not shown in FIG. 2A. The computer provides control of the operation for processing a Zr—Sn—Ti—O dielectric layer by regulating the flow of precursor gases into reaction chamber 220. The computer may control the flow rate of precursor gases and the pulsing periods for these gases by controlling mass-flow controllers 256-259. Additionally, the computer may control the temperature of gas sources 251-254. Further, the pulse period and flow of purging gases from purging gas sources 261, 262 may be regulated through computer control of mass-flow controllers 266, 267, respectively.

The computer may also regulate the environment of reactor chamber 220 in which a dielectric film is being formed on substrate 210. The computer regulates the pressure in reaction chamber 220 within a predetermined pressure range by controlling vacuum pumps 281, 282 through mass-flow controllers 286, 287, respectively. The computer also regulates the temperature range for substrate 210 within a predetermined range by controlling heater 230.

For convenience, the individual control lines to elements of ALD 200, as well as a computer, are not shown in FIG. 2A. The above description of the computer control in conjunction with FIG. 2A provides information for those skilled in the art to practice embodiments for forming a dielectric layer containing Zr—Sn—Ti—O using a computerized method as described herein.

The embodiments described herein provide a process for growing a dielectric film having a wide range of useful equivalent oxide thickness, $t_{eq}$, associated with a dielectric constant in the range from about 33 to about 70. With increased percentage of Ti and decreased percentage of Zr and Sn in a Zr—Sn—Ti—O dielectric film, the dielectric film composition approaches that of $TiO_x$, where $TiO_2$ has a dielectric constant of about 80, and a relatively low breakdown electric field. With increased percentage of Zr and decreased percentage of Ti and Sn in a Zr—Sn—Ti—O dielectric film, the dielectric film composition approaches that of $ZrO_x$, where $ZrO_2$ has a dielectric constant of about 25, and a relatively higher breakdown electric field. Inclusion of tin in the Zr—Sn—Ti—O layer aids in the production of a dielectric layer with increased electric field breakdown and reduced leakage current. Further, ALD processing of amorphous Ti-rich Zr—Sn—Ti—O dielectric films allows for selecting a dielectric film with a composition having good electric field breakdown and leakage current properties while maintaining a relatively high dielectric constant. For example, a 40-50 nm thick film of $Zr_{0.2}Sn_{0.2}TiO_{0.6}O_2$ can have a dielectric constant in the range of about 50 to about 70 with a breakdown electric field of about 3 to about 5 MV/cm and a leakage current in the range of about $10^{-9}$ to about $10^{-7}$ A/cm$^2$ at 1.0 MV/cm.

The $t_{eq}$ range in accordance with embodiments of the present invention are shown in the following

| κ | Physical Thickness t = 1.0 nm (1.0 × 10¹ Å) $t_{eq}$ (Å) | Physical Thickness t = 5.0 nm (5.0 × 10¹ Å) $t_{eq}$ (Å) | Physical Thickness t = 100.0 nm (1 × 10³ Å) $t_{eq}$ (Å) | Physical Thickness t = 450 nm (4.5 × 10³ Å) $t_{eq}$ (Å) |
|---|---|---|---|---|
| 33 | 1.18 | 5.91 | 118.18 | 531.82 |
| 37 | 1.05 | 5.27 | 105.41 | 474.32 |
| 50 | 0.78 | 3.90 | 78.00 | 351.00 |
| 70 | 0.56 | 2.79 | 55.71 | 250.71 |

The relatively large dielectric constant for material layers of Zr—Sn—Ti—O allows for the engineering of dielectric films having a physical thickness in the 100 nm (1000 Å) range, while achieving a $t_{eq}$ of less than 120 Å. From above, it is apparent that a film containing Zr—Sn—Ti—O may be attained with a $t_{eq}$ ranging from about 2.5 Å to about 6 Å. Further, an atomic layer deposited Zr—Sn—Ti—O film may provide a $t_{eq}$ significantly less than 2 or 3 Å, even less than 1.5 Å.

Attainment of a $t_{eq}$ in the monolayer thickness range requires that an interfacial layer between a semiconductor substrate surface and the Zr—Sn—Ti—O dielectric layer be exceptionally small or composed of a material having a dielectric constant approaching that of the Zr—Sn—Ti—O value. The formation of a $SiO_2$ interfacial layer should be avoided. Thus, the preparation of the semiconductor substrate surface prior to the first pulse of the first sequence of the ALD process should include removing any $SiO_2$ layer that may exist and preventing the formation of a $SiO_2$ prior to the beginning of the ALD process. During, the ALD process, selection of appropriate precursors may prevent the formation of a $SiO_2$ layer. Further, to assist in the reduction or elimination of a $SiO_2$ interfacial layer, the deposition of the first precursor, typically a non-oxygen containing precursor in various embodiments, on the semiconductor surface should be uniform across the substrate surface. This uniform distribution may aid in avoiding a reaction of the second precursor, an oxygen containing precursor, with the substrate surface rather than with the first precursor.

Any micro-roughness associated with thin films of Zr—Sn—Ti—O may be due to partial monolayer formation of the dielectric layer across the substrate surface. With some areas of the dielectric layer forming a monolayer in two or three cycles, while another area or region of the layer forms a monolayer in one or two cycles, the surface of the Zr—Sn—Ti—O dielectric layer may exhibit some micro-roughness. Uniform distribution across the substrate surface of each precursor in a sequence may help to alleviate the occurrence of such micro-roughness of the dielectric layer. As can be understood by those skilled in the art, particular growth rates and processing conditions for providing a Zr—Sn—Ti—O dielectric layer with reduction or substantially eliminated micro-roughness may be determined during normal initial testing of the ALD system for processing a Zr—Sn—Ti—O dielectric film for a given application without undue experimentation.

Further, dielectric films of Zr—Sn—Ti—O formed by atomic layer deposition may provide not only ultra thin $t_{eq}$ films, but also films with relatively low leakage current. In addition to using ALD to provide precisely engineered film thicknesses with engineered dielectric constants, good breakdown electric field properties, and relatively low leakage currents, ALD processing provides for dielectric films that provide conformal layering onto selected substrate surfaces.

The novel processes described above for performing atomic layer deposition of Zr—Sn—Ti—O may precisely control the thickness of the dielectric layer formed, where, in addition to providing an ultra thin $t_{eq}$, the atomic layer deposition process provides for relatively smooth surfaces and limited interfacial layer formation. Additionally, these embodiments for ALD processing of Zr—Sn—Ti—O dielectric films may be implemented to form transistors, capacitors, memory devices, and other electronic systems including information handling devices. With careful preparation and engineering of the Zr—Sn—Ti—O layer, limiting the size of interfacial regions, a teq of about 5 Å to about 3 Å or lower for these devices is anticipated.

In an embodiment, a dielectric layer may include a film containing atomic layer deposited Zr—Sn—Ti—O. In an embodiment, the film contains an amorphous Ti-rich Zr—Sn—Ti—O film. In another embodiment, the film may include Zr—Sn—Ti—O having a composition substantially of $Zr_ySn_xTi_{1-x-y}O_4$ with 0.3<y<0.7 and 0<x<0.2. In another embodiment, the film may include Zr—Sn—Ti—O having a composition substantially of $Zr_{0.2}Sn_{0.2}Ti_{0.6}O_2$. Such a dielectric layer may have applications in a wide variety of electronic systems. With a relatively high dielectric constant, a dielectric layer including a film containing atomic layer deposited Zr—Sn—Ti—O may be used in electro-optic devices, microwave devices, transistors, memories, information handling devices, and other electronic systems.

A transistor 100 as depicted in FIG. 1 may be formed by forming a source region 120 and a drain region 130 in a silicon based substrate 110 where source and drain regions 120, 130 are separated by a body region 132. Body region 132 defines a channel having a channel length 134. A dielectric film is disposed on substrate 110 formed as a layer containing Zr—Sn—Ti—O on substrate 110 by atomic layer deposition. The resulting Zr—Sn—Ti—O dielectric layer forms gate dielectric 140.

A gate 150 is formed over gate dielectric 140. Typically, forming gate 150 may include forming a polysilicon layer, though a metal gate may be formed in an alternative process. Forming the substrate, the source and drain regions, and the gate is performed using standard processes known to those skilled in the art. Additionally, the sequencing of the various elements of the process for forming a transistor is conducted with standard fabrication processes, also as known to those skilled in the art.

Figure 5:
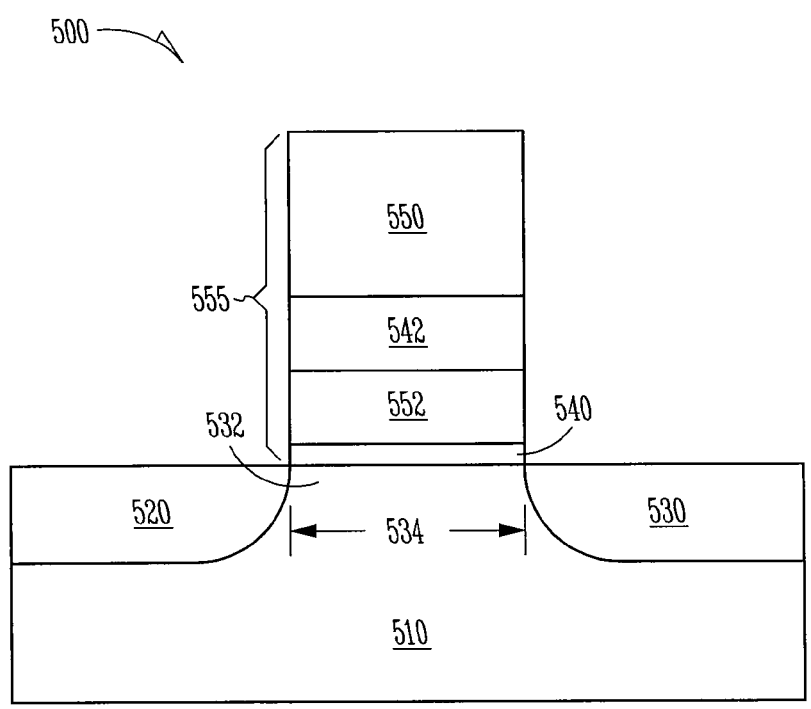
FIG. 5 shows an embodiment of a configuration of a transistor having an atomic layer deposited Zr—Sn—Ti—O dielectric film, according to the teachings of the present invention.

The method for forming an atomic layer deposited Zr—Sn—Ti—O in various embodiments may be applied to other transistor structures having dielectric layers. FIG. 5 shows an embodiment of a configuration of a transistor 500 having an atomic layer deposited Zr—Sn—Ti—O dielectric film. Transistor 500 may include a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. Gate dielectric 540 may be formed containing atomic layer deposited Zr—Sn—Ti—O as described above with the remaining elements of the transistor 500 formed using processes known to those skilled in the art. Alternately, both gate dielectric 540 and floating gate dielectric 542 may be formed as dielectric layers containing Zr—Sn—Ti—O in various embodiments as described herein.

The embodiments of methods for forming Zr—Sn—Ti—O dielectric films may also be applied to forming capacitors in various integrated circuits, memory devices, and electronic systems. In an embodiment for forming a capacitor, a method may include forming a first conductive layer, forming a dielectric film containing Zr—Sn—Ti—O on the first conductive layer by atomic layer deposition, and forming a second conductive layer on the dielectric film. ALD formation of the Zr—Sn—Ti—O dielectric film allows the dielectric film to be engineered within a predetermined composition providing a desired dielectric constant. Alternately, forming a conductive layer on a substrate, forming a dielectric film containing Zr—Sn—Ti—O using any of the embodiments described herein, and forming another conductive layer on the dielectric film can construct a capacitor.

Figure 6:
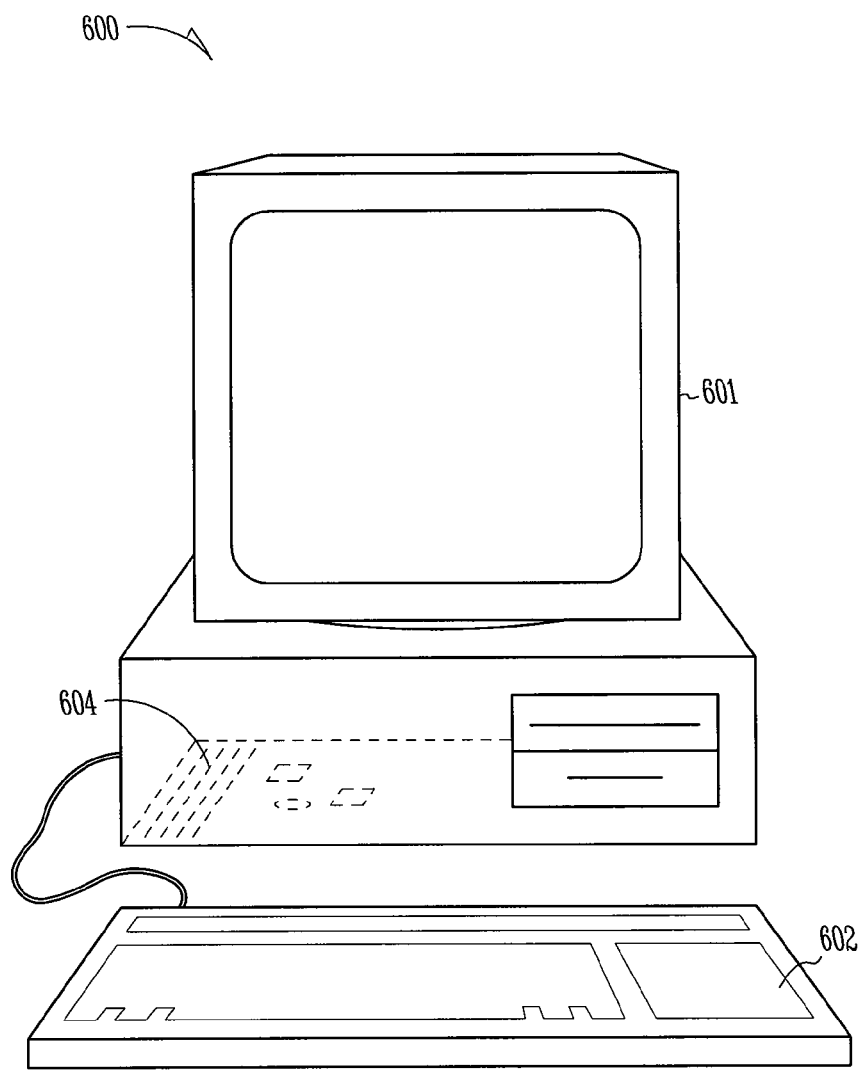
FIG. 6 shows an embodiment of a personal computer incorporating devices having an atomic layer deposited Zr—Sn—Ti—O dielectric film, according to the teachings of the present invention.
Figure 7:
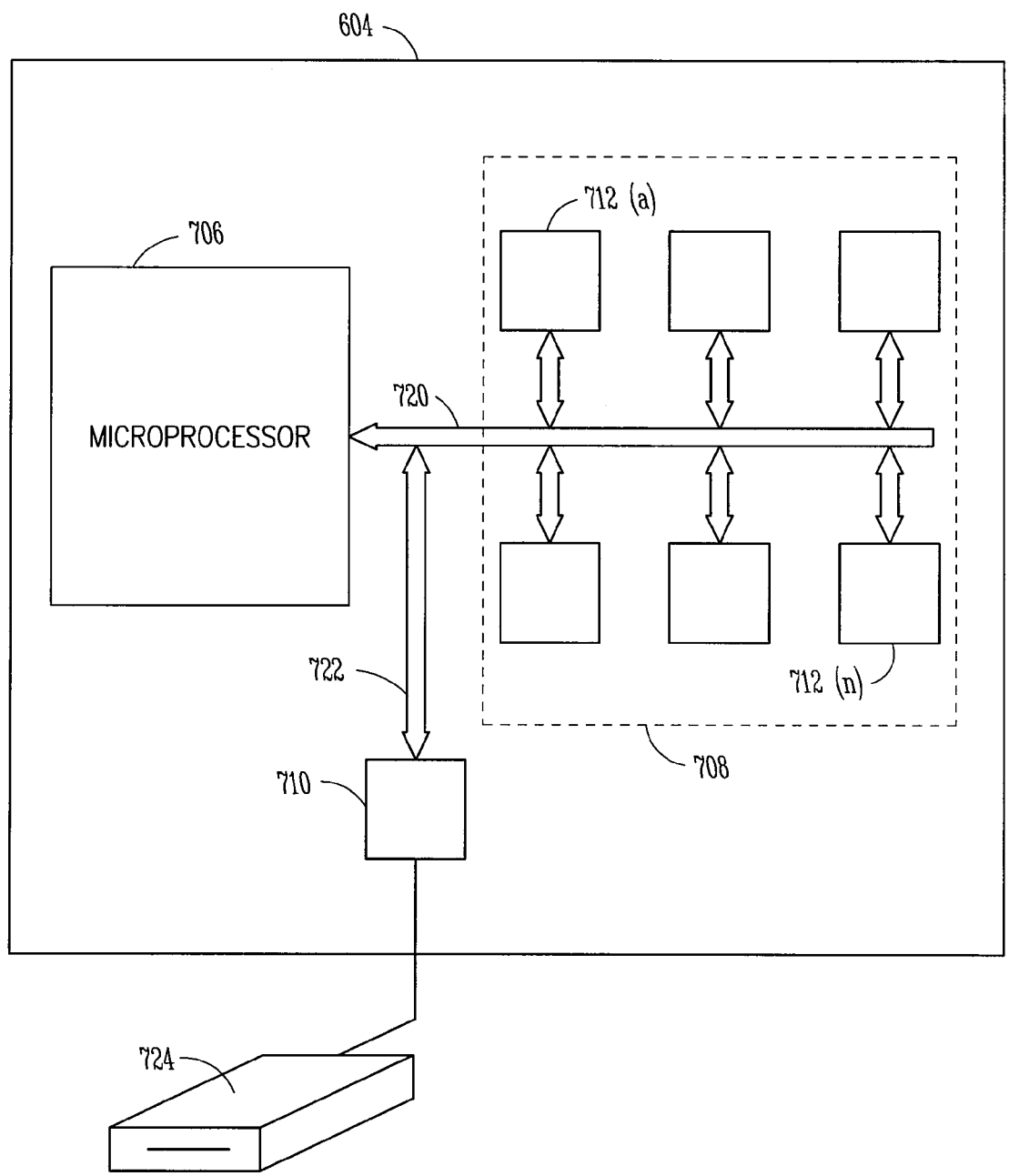
FIG. 7 illustrates a schematic view of an embodiment of a central processing unit incorporating devices having an atomic layer deposited Zr—Sn—Ti—O dielectric film, according to the teachings of the present invention.
Figure 8:
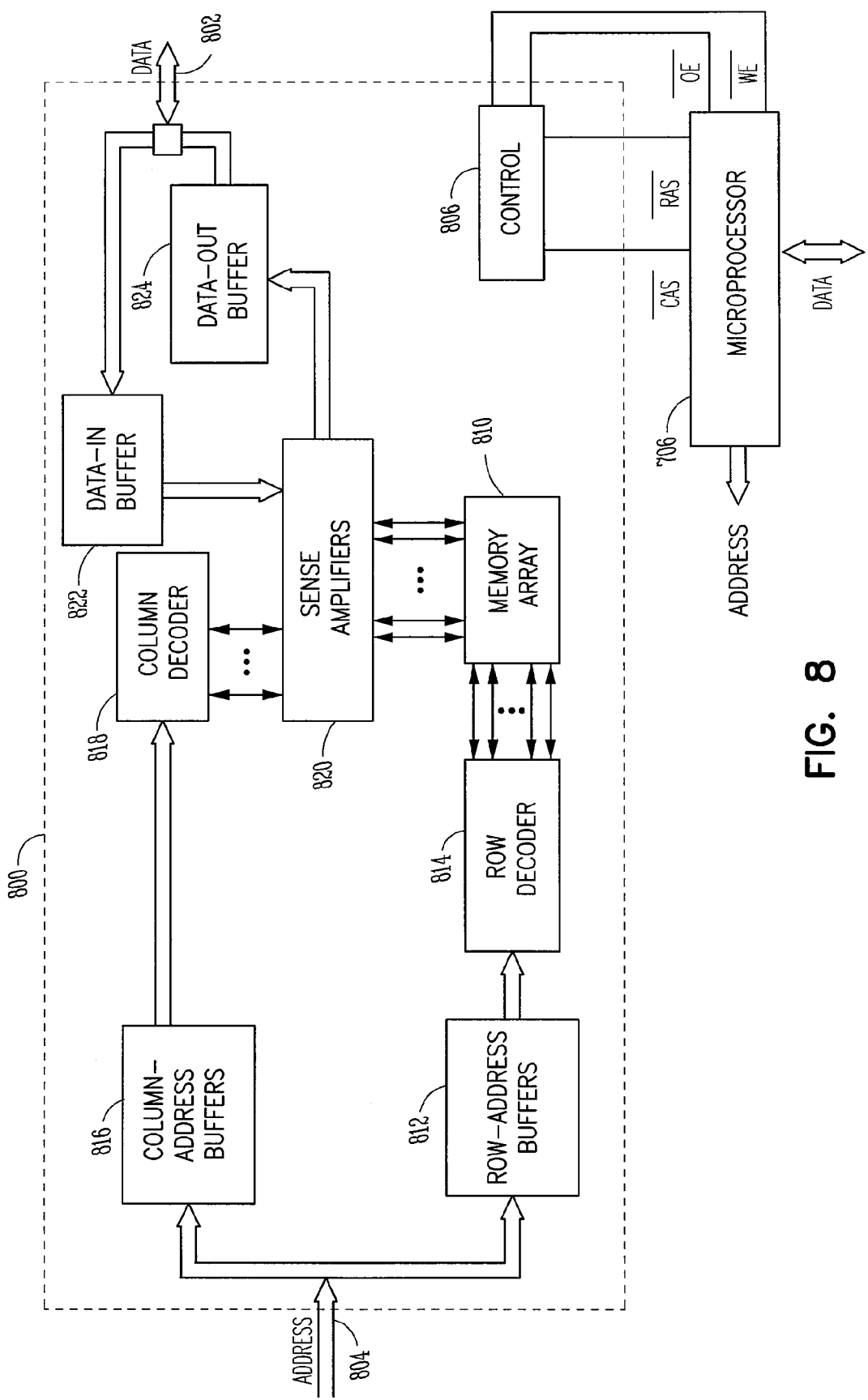
FIG. 8 illustrates a schematic view of an embodiment of a DRAM memory device having an atomic layer deposited Zr—Sn—Ti—O dielectric film, according to the teachings of the present invention.

Transistors, capacitors, and other devices having dielectric films containing atomic layer deposited Zr—Sn—Ti—O formed by the methods described above may be implemented into memory devices and electronic systems including information handling devices. Such information devices may include wireless systems, telecommunication systems, and computers. An embodiment of a computer having a dielectric layer containing atomic layer deposited Zr—Sn—Ti—O is shown in FIGS. 6-8 and described below. While specific types of memory devices and computing devices are shown below, it will be recognized by one skilled in the art that several types of memory devices and electronic systems including information handling devices utilize the invention.

A personal computer, as shown in FIGS. 6 and 7, may include a monitor 600, keyboard input 602 and a central processing unit 604. Central processor unit 604 typically may include microprocessor 706, memory bus circuit 708 having a plurality of memory slots 712(a-n), and other peripheral circuitry 710. Peripheral circuitry 710 permits various peripheral devices 724 to interface processor-memory bus 720 over input/output (I/O) bus 722. The personal computer shown in FIGS. 6 and 7 also may include at least one transistor having a dielectric layer containing atomic layer deposited Zr—Sn—Ti—O according an embodiment of the present invention.

Microprocessor 706 produces control and address signals to control the exchange of data between memory bus circuit 708 and microprocessor 706 and between memory bus circuit 708 and peripheral circuitry 710. This exchange of data is accomplished over high speed memory bus 720 and over high speed I/O bus 722.

Coupled to memory bus 720 are a plurality of memory slots 712(a-n), which receive memory devices well known to those skilled in the art. For example, single in-line memory modules (SIMMs) and dual in-line memory modules (DIMMs) may be used in the implementation of embodiment of the present invention.

These memory devices may be produced in a variety of designs that provide different methods of reading from and writing to the dynamic memory cells of memory slots 712. One such method is the page mode operation. Page mode operations in a DRAM are defined by the method of accessing a row of a memory cell arrays and randomly accessing different columns of the array. Data stored at the row and column intersection may be read and output while that column is accessed. Page mode DRAMs require access steps, which limit the communication speed of memory circuit 708.

An alternate type of device is the extended data output (EDO) memory, which allows data stored at a memory array address to be available as output after the addressed column has been closed. This memory may increase some communication speeds by allowing shorter access signals without reducing the time in which memory output data is available on memory bus 720. Other alternative types of devices include SDRAM, DDR SDRAM, SLDRAM and Direct RDRAM as well as others such as SRAM or Flash memories.

FIG. 8 illustrates a schematic view of an embodiment of a DRAM memory device 800 having an atomic layer deposited Zr—Sn—Ti—O dielectric film. Illustrative DRAM memory device 800 is compatible with memory slots 712(a-n). The description of DRAM memory device 800 has been simplified for purposes of illustrating a DRAM memory device and is not intended to be a complete description of all the features of a DRAM. Those skilled in the art will recognize that a wide variety of memory devices may be used in the implementation of embodiments of the present invention. The embodiment of a DRAM memory device shown in FIG. 8 may include at least one transistor having a gate dielectric containing atomic layer deposited Zr—Sn—Ti—O according to the teachings of the present invention.

Control, address and data information provided over memory bus 720 is further represented by individual inputs to DRAM 800, as shown in FIG. 8. These individual representations are illustrated by data lines 802, address lines 804 and various discrete lines directed to control logic 806.

As is well known in the art, DRAM 800 may include memory array 810, which in turn comprises rows and columns of addressable memory cells. Each memory cell in a row is coupled to a common word line. The word line is coupled to gates of individual transistors, where at least one transistor has a gate coupled to a gate dielectric containing atomic layer deposited Zr—Sn—Ti—O in accordance with the method and structure previously described above. Additionally, each memory cell in a column is coupled to a common bit line. Each cell in memory array 810 may include a storage capacitor and an access transistor as is conventional in the art.

DRAM 800 interfaces with, for example, microprocessor 706 through address lines 804 and data lines 802. Alternatively, DRAM 800 may interface with a DRAM controller, a micro-controller, a chip set or other electronic system. Microprocessor 706 also provides a number of control signals to DRAM 800, including but not limited to, row and column address strobe signals RAS and CAS, write enable signal WE, an output enable signal OE and other conventional control signals.

Row address buffer 812 and row decoder 814 receive and decode row addresses from row address signals provided on address lines 804 by microprocessor 706. Each unique row address corresponds to a row of cells in memory array 810. Row decoder 814 may include a word line driver, an address decoder tree, and circuitry which translates a given row address received from row address buffers 812 and selectively activates the appropriate word line of memory array 810 via the word line drivers.

Column address buffer 816 and column decoder 818 receive and decode column address signals provided on address lines 804. Column decoder 818 also determines when a column is defective and the address of a replacement column. Column decoder 818 is coupled to sense amplifiers 820. Sense amplifiers 820 are coupled to complementary pairs of bit lines of memory array 810.

Sense amplifiers 820 are coupled to data-in buffer 822 and data-out buffer 824. Data-in buffers 822 and data-out buffers 824 are coupled to data lines 802. During a write operation, data lines 802 provide data to data-in buffer 822. Sense amplifier 820 receives data from data-in buffer 822 and stores the data in memory array 810 as a charge on a capacitor of a cell at an address specified on address lines 804.

During a read operation, DRAM 800 transfers data to microprocessor 706 from memory array 810. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 820 detects and amplifies a difference in voltage between the complementary bit lines. The sense amplifier passes the amplified voltage to data-out buffer 824.

Control logic 806 is used to control the many available functions of DRAM 800. In addition, various control circuits and signals not detailed herein initiate and synchronize DRAM 800 operation as known to those skilled in the art. As stated above, the description of DRAM 800 has been simplified for purposes of illustrating an embodiment of the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of embodiments of the present invention. The DRAM implementation described herein is illustrative only and not intended to be exclusive or limiting.

CONCLUSION

A dielectric film containing atomic layer deposited Zr—Sn—Ti—O and a method of fabricating such a dielectric film produce a reliable dielectric film having an equivalent oxide thickness thinner than attainable using $SiO_2$. Dielectric films containing atomic layer deposited Zr—Sn—Ti—O formed using the methods described herein are thermodynamically stable such that the dielectric films formed will have minimal reactions with a silicon substrate or other structures during processing.

Zr—Sn—Ti—O films formed by atomic layer deposition may be amorphous and conformally layered on a substrate surface. Engineering the composition of the Zr—Sn—Ti—O films may provide for selecting a dielectric film with increased breakdown electric fields and decreased leakage currents with relatively high dielectric constant relative to a Zr—Sn—Ti—O film with higher dielectric constant but lower breakdown electric fields and decreased leakage current. Further, the ALD formation of a Zr—Sn—Ti—O dielectric film provides for enhanced dielectric and electrical properties relative to those attained with an amorphous $SiO_x$ film. These properties of layers containing atomic layer deposited Zr—Sn—Ti—O films allow for application as dielectric layers in numerous electronic devices and systems.

Capacitors, transistors, higher level ICs or devices, and electronic systems are constructed utilizing the novel process for forming a dielectric film having an ultra thin equivalent oxide thickness, $t_{eq}$. Gate dielectric layers or films containing atomic layer deposited Zr—Sn—Ti—O are formed having a dielectric constant substantially higher than that of silicon oxide, where the dielectric films are capable of a $t_{eq}$ thinner than 10 Å, thinner than the expected limit for $SiO_2$ gate dielectrics. At the same time, the physical thickness of the atomic layer deposited Zr—Sn—Ti—O dielectric film is much larger than the $SiO_2$ thickness associated with the $t_{eq}$ limit of $SiO_2$. Forming the relatively larger thickness provides advantages in processing gate dielectrics and other dielectric layers. Further, a Zr—Sn—Ti—O film processed in relatively low temperatures allowed by atomic layer deposition may provide amorphous dielectric films having relatively low leakage current for use as dielectric layers in electronic devices and systems.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A dielectric layer comprising: a Zr—Sn—Ti—O film such that Zr—Sn—Ti—O material is configured as substantially atomic monolayers, the dielectric layer including a solid solution of titanium oxide, zirconium oxide, and tin oxide as part of the Zr—Sn—Ti—O film or in addition to the Zr—Sn—Ti—O film.

2. The dielectric layer of claim 1, wherein the dielectric layer includes an amorphous Ti—rich Zr—Sn—Ti—O layer.

3. The dielectric layer of claim 1, wherein the dielectric layer includes a composition substantially of $Zr_y Sn_x Ti_{1-x-y} O_4$ with $0.3<y<0.7$ and $0<x<0.2$.

4. The dielectric layer of claim 1, wherein the dielectric layer includes a composition substantially of $Zr_{0.2} Sn_{0.2} Ti_{0.6} O_2$.

5. The dielectric layer of claim 1, wherein the Zr—Sn—Ti—O film as a surface opposite a substrate on which the dielectric layer is disposed, the surface having a roughness less than a monolayer of the Zr—Sn—Ti—O film.

6. The dielectric layer of claim 1, wherein the dielectric layer is disposed above a silicon based substrate.

7. The dielectric layer of claim 1, wherein the dielectric layer is disposed in a storage capacitor of a cell in a memory array.

8. The dielectric layer of claim 1, wherein the Zr—Sn—Ti—O film is disposed on a barrier layer, the barrier layer having a higher dielectric constant than $SiO_2$, the barrier layer interfacing with silicon below the barrier layer such that a carrier mobility in the silicon in maintained at least at a level provided by $SiO_2$ on silicon.

9. The dielectric layer of claim 8, wherein the silicon below the barrier layer includes a silicon-on-sapphire substrate.

10. An electronic system comprising: a dielectric layer containing a Zr—Sn—Ti—O film such that Zr—Sn—Ti—O material is configured as substantially atomic monolayers, the dielectric layer including a solid solution of titanium oxide, zirconium oxide, and tin oxide as part of Zr—Sn—Ti—O film or in addition to the Zr—Sn—Ti—O film.

11. The transistor of claim 10, wherein the dielectric layer includes an amorphous Ti-rich Zr—Sn—Ti—O film.

12. The electronic system of claim 10, wherein the dielectric layer includes a dielectric film having a composition substantially of $Zr_y Sn_x Ti_{1-x-y} O_4$ with $0.3<y<0.7$ and $0<x<0.2$.

13. A capacitor, comprising:
a first conductive layer;
a dielectric layer having a Zr—Sn—Ti—O film such that Zr—Sn—Ti—O material is configured as substantially atomic monolayers, the dielectric layer including a solid solution of titanium oxide, zirconium oxide, and tin oxide as part of the Zr—Sn—Ti—O film or in addition to the Zr—Sn—Ti—O film, the dielectric layer disposed on the first conductive layer; and
a second conductive layer disposed on the dielectric layer.

14. The capacitor of claim 13, wherein the dielectric layer includes an amorphous Ti-rich Zr—Sn—Ti—O film.

15. The capacitor of claim 13, wherein the dielectric layer exhibits a dielectric constant in the range from about 50 to about 70.

16. A transistor comprising:
a body region between a source region and a drain region;
a dielectric layer having a Zr—Sn—Ti—O film such that Zr—Sn—Ti—O material is configured as substantially atomic monolayers, the dielectric layer including a solid solution of titanium oxide, zirconium oxide, and tin oxide as part of the Zr—Sn—Ti—O film or in addition to the Zr—Sn—Ti—O film, the dielectric layer disposed on the body region between the source region and the drain region; and
a gate coupled to the dielectric film.

17. The transistor of claim 16, wherein the gate includes a floating gate.

18. The transistor of claim 16, wherein the dielectric layer exhibits a dielectric constant in the range from about 50 to about 70.

19. The transistor of claim 16, wherein the dielectric layer exhibits an equivalent oxide thickness ($t_{eq}$) less than about 10 Angstroms.

20. The transistor of claim 16, wherein the dielectric layer exhibits an equivalent oxide thickness ($t_{eq}$) of less than about 3 Angstroms.

21. The transistor of claim 16, wherein the dielectric layer includes an amorphous Ti—rich Zr—Sn—Ti—O film.

22. A memory comprising:
a number of access transistors, at least one access transistor including a gate coupled to a dielectric layer containing a Zr—Sn—Ti—O film such that Zr—Sn—Ti—O material is configured as substantially atomic monolayers, the dielectric layer including a solid solution of titanium oxide, zirconium oxide, and tin oxide as part of the Zr—Sn—Ti—O film or in addition to the Zr—Sn—Ti—O film, the dielectric layer disposed on a body region between a source region and a drain region;
a number of word lines coupled to a number of the gates of the number of access transistors;
a number of source lines coupled to a number of the source regions of the number of access transistors; and
a number of bit lines coupled to a number of the drain regions of the number of access transistors.

23. The memory array of claim 22, wherein the dielectric layer has a dielectric constant in the range from about 50 to about 70.

24. The memory array of claim 22, wherein the dielectric layer has an equivalent oxide thickness ($t_{eq}$) less than about 10 Angstroms.

25. An electronic system comprising:
a processor;
a system bus; and
a memory array coupled to the processor by the system bus, the memory array including:
a number of access transistors, at least one access transistor having a gate coupled to a dielectric film containing a Zr—Sn—Ti—O film such that Zr—Sn—Ti—O material is configured as substantially atomic monolayers, the dielectric film including a solid solution of titanium oxide, zirconium oxide, and tin oxide as part of the Zr—Sn—Ti—O film or in addition to the Zr—Sn—Ti—O film, the dielectric film disposed on a body region between a source region and a drain region;
a number of word lines coupled to a number of the gates of the number of access transistors;
a number of source lines coupled to a number of the source regions of the number of access transistors; and
a number of bit lines coupled to a number of the drain regions of the number of access transistors.

26. The electronic system of claim 25, wherein the dielectric film has a dielectric constant in the range from about 50 to about 70.

27. The electronic system of claim 25, wherein the film exhibits an equivalent oxide thickness ($t_{eq}$) less than about 10 Angstroms.

* * * * *